United States Patent
Stewart et al.

(10) Patent No.: US 12,355,025 B2
(45) Date of Patent: *Jul. 8, 2025

(54) STANDALONE ISOLATION CAPACITOR

(71) Applicant: Texas Instruments Incorporated, Dallas, TX (US)

(72) Inventors: Elizabeth Costner Stewart, Dallas, TX (US); Thomas Dyer Bonifield, Dallas, TX (US); Jeffrey Alan West, Dallas, TX (US); Byron Lovell Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/390,395

(22) Filed: Dec. 20, 2023

(65) Prior Publication Data
US 2024/0120367 A1 Apr. 11, 2024

Related U.S. Application Data

(63) Continuation of application No. 17/529,750, filed on Nov. 18, 2021, now Pat. No. 11,901,402.

(51) Int. Cl.
*H01L 23/00* (2006.01)
*H01L 23/495* (2006.01)
*H01L 25/16* (2023.01)
*H01L 49/02* (2006.01)

(52) U.S. Cl.
CPC ........ *H01L 28/60* (2013.01); *H01L 23/49575* (2013.01); *H01L 24/05* (2013.01); *H01L 25/16* (2013.01); *H01L 2224/0556* (2013.01); *H01L 2224/05624* (2013.01)

(58) Field of Classification Search
CPC . H01L 28/60; H01L 25/16; H01L 2224/0556; H01L 23/49503; H01L 23/49589
See application file for complete search history.

(56) References Cited

U.S. PATENT DOCUMENTS

| | | |
|---|---|---|
| 6,441,419 B1 | 8/2002 | Johnson et al. |
| 6,841,455 B2 | 1/2005 | West et al. |
| 8,405,189 B1 | 3/2013 | Ward et al. |
| 8,890,223 B1 | 11/2014 | Bonifield et al. |
| 9,087,853 B2 | 7/2015 | Tao et al. |
| 9,299,697 B2 | 3/2016 | West et al. |

(Continued)

*Primary Examiner* — Mamadou L Diallo
(74) *Attorney, Agent, or Firm* — Yudong Kim; Frank D. Cimino

(57) ABSTRACT

An electronic device includes a first dielectric layer above a semiconductor layer, lower-bandgap dielectric layer above the first dielectric layer, the lower-bandgap dielectric layer having a bandgap energy less than a bandgap energy of the first dielectric layer, a first capacitor plate above the lower-bandgap dielectric layer in a first plane of first and second directions, a second dielectric layer above the first capacitor plate, a second capacitor plate above the second dielectric layer in a second plane of the first and second directions, the first and second capacitor plates spaced apart from one another along a third direction, and a conductive third capacitor plate above the second dielectric layer in the second plane, the third capacitor plate spaced apart from the second capacitor plate in the second plane.

20 Claims, 23 Drawing Sheets

(56) References Cited

U.S. PATENT DOCUMENTS

| | | |
|---|---|---|
| 9,583,558 B2 | 2/2017 | West et al. |
| 2005/0215022 A1 | 9/2005 | Adam et al. |
| 2006/0145251 A1 | 7/2006 | Ko |
| 2006/0189089 A1 | 8/2006 | Larkin et al. |
| 2007/0296085 A1 | 12/2007 | Coolbaugh et al. |
| 2010/0032741 A1 | 2/2010 | Ueno |
| 2011/0031581 A1 | 2/2011 | West |
| 2011/0227227 A1 | 9/2011 | West |
| 2012/0146124 A1 | 6/2012 | Hafez et al. |
| 2012/0205251 A1 | 8/2012 | Kalkan |
| 2012/0211868 A1 | 8/2012 | Stribley et al. |
| 2013/0001738 A1 | 1/2013 | Dong |
| 2014/0145297 A1 | 5/2014 | Daamen et al. |
| 2014/0145301 A1 | 5/2014 | Moghe et al. |
| 2014/0183698 A1 | 7/2014 | Hsu et al. |
| 2014/0252551 A1 | 9/2014 | Dix et al. |
| 2014/0253227 A1 | 9/2014 | Yach et al. |
| 2014/0264740 A1 | 9/2014 | Stribley |
| 2015/0115407 A1 | 4/2015 | Tao et al. |
| 2015/0214292 A1 | 7/2015 | Tao et al. |
| 2015/0333055 A1* | 11/2015 | West .............. H01L 28/91 257/306 |
| 2018/0083588 A1* | 3/2018 | Yun .............. H01G 4/40 |
| 2018/0286802 A1* | 10/2018 | West .............. H01L 21/768 |
| 2019/0206812 A1* | 7/2019 | Bonifield .......... H01L 23/49575 |
| 2020/0168534 A1* | 5/2020 | Bonifield .......... H01L 23/49503 |
| 2020/0312794 A1* | 10/2020 | West .............. H01L 23/645 |
| 2021/0193791 A1* | 6/2021 | Kasha .............. H01L 24/85 |
| 2021/0305178 A1* | 9/2021 | West .............. H01L 23/585 |
| 2022/0285263 A1* | 9/2022 | Lo .............. H01L 23/5226 |
| 2022/0293589 A1* | 9/2022 | Kim .............. H01L 27/0629 |
| 2022/0351908 A1* | 11/2022 | Wang .............. H01L 28/92 |
| 2023/0056046 A1* | 2/2023 | Williams .......... H01L 23/49562 |

* cited by examiner

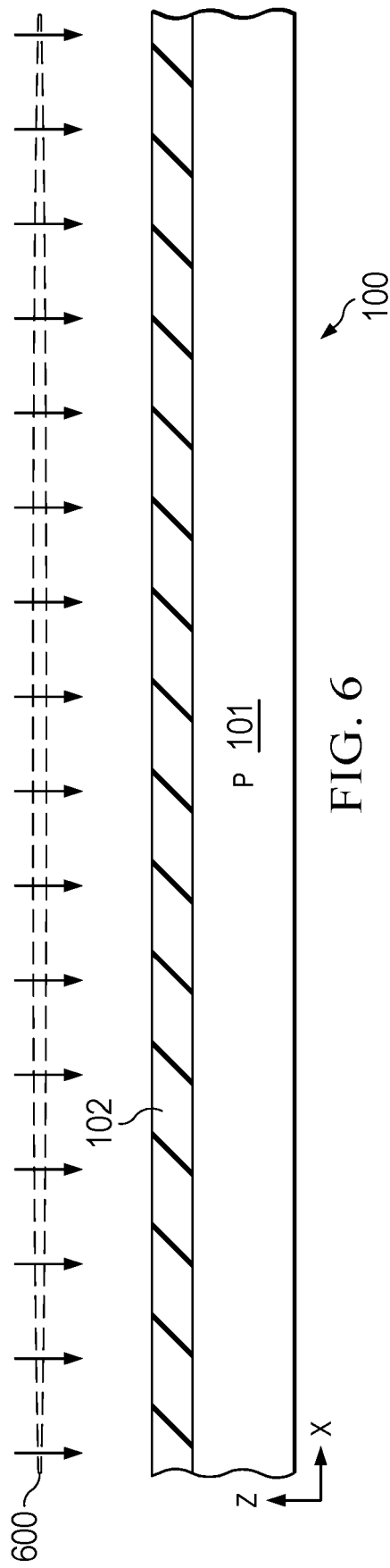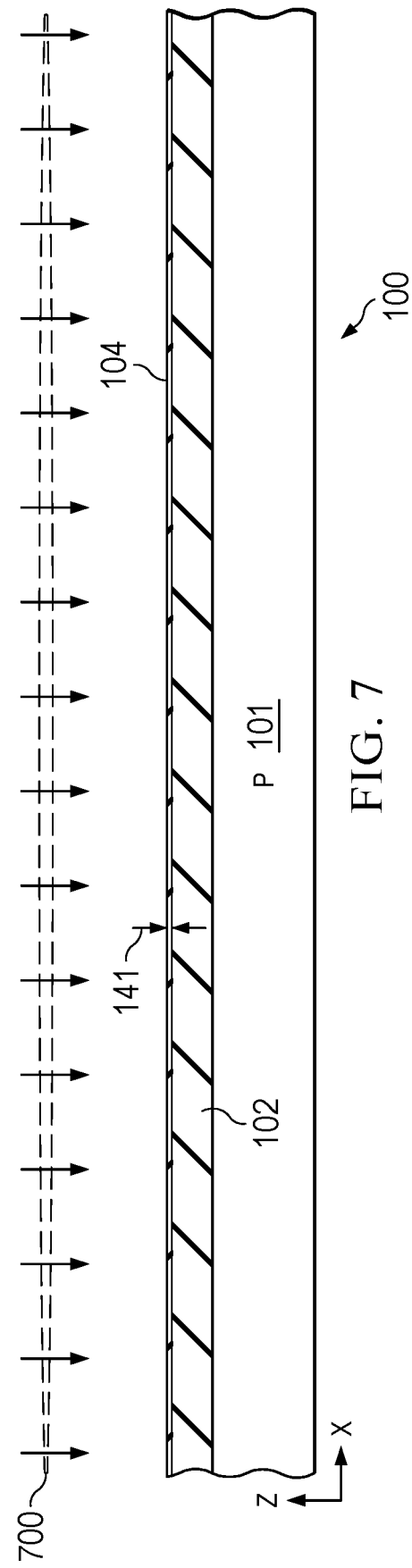

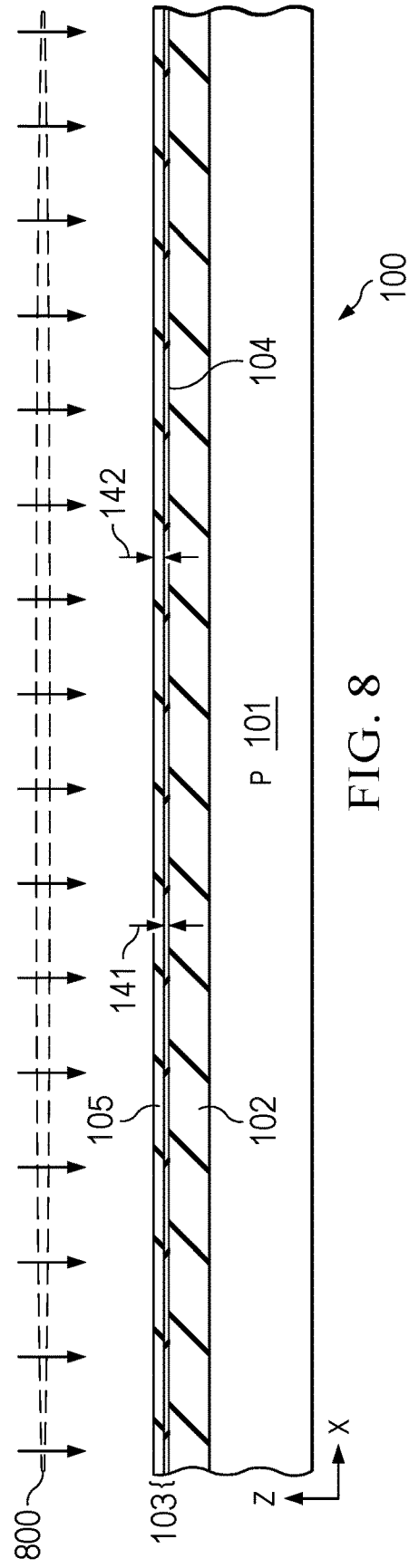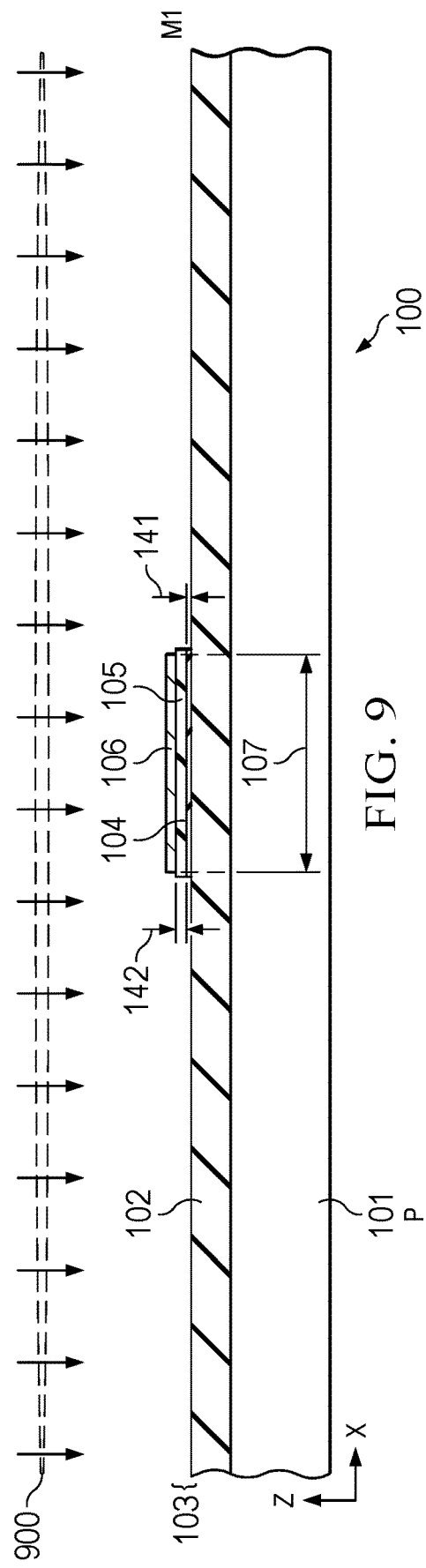

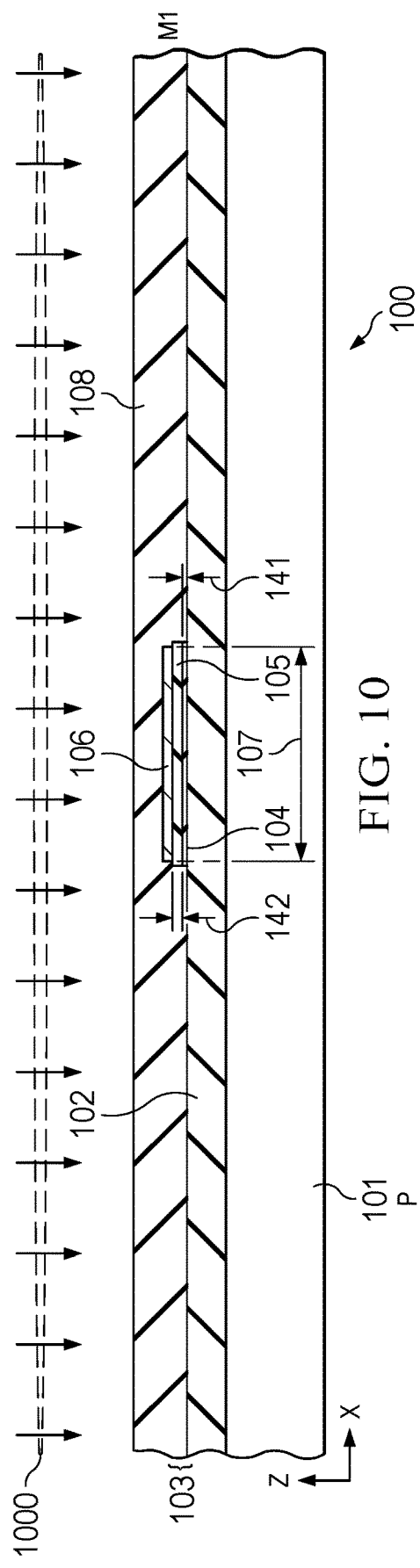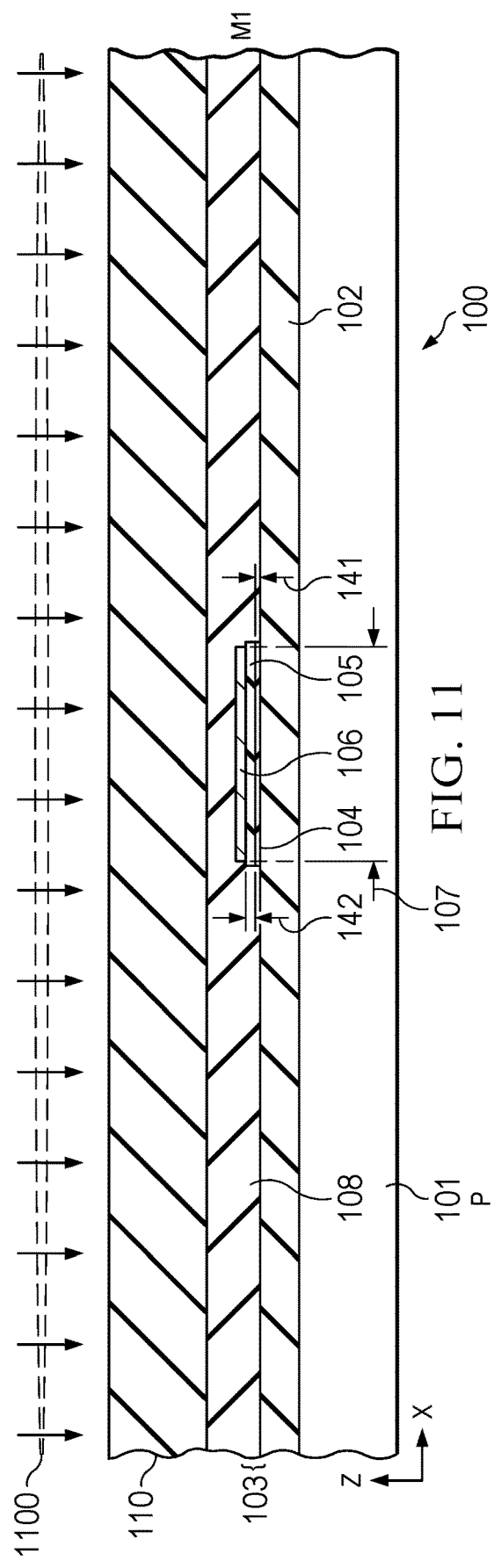

STANDALONE ISOLATION CAPACITOR

CROSS REFERENCE TO RELATED APPLICATIONS

This application is a continuation of application Ser. No. 17/529,750 filed Nov. 18, 2021, which is hereby incorporated herein by reference in its entirety.

BACKGROUND

Multi-chip modules (MCMs) are packaged electronic devices with two or more semiconductor dies in a package structure. An isolation die can be provided for isolation between circuits of two other dies operating at different voltages. A standalone isolation capacitor die can include upper and lower capacitor plates, where the lower plate is not connected to ground and can float to a mid-point voltage between ground and a high voltage applied to the upper plate. The high voltage can lead to a high electric field on the bottom plate that causes low voltage breakdown of the device. Adding a thick dielectric below the bottom plate to isolate it from the substrate increases cost, and thick oxides increase wafer bow during manufacturing.

SUMMARY

In one aspect, an electronic device includes a semiconductor layer, a first dielectric layer above the semiconductor layer, and a lower-bandgap dielectric layer above the first dielectric layer, in which the lower-bandgap dielectric layer has a bandgap energy less than a bandgap energy of the first dielectric layer. The electronic device also includes a conductive first capacitor plate above the lower-bandgap dielectric layer in a first plane of orthogonal first and second directions, a second dielectric layer above the first capacitor plate, and a conductive second capacitor plate above the second dielectric layer in a second plane of the first and second directions. The first and second capacitor plates are spaced apart from one another along an orthogonal third direction to form a first capacitor. The electronic device also includes a conductive third capacitor plate above the second dielectric layer in the second plane. The third capacitor plate is spaced apart from the second capacitor plate in the second plane, and the first and third capacitor plates spaced apart from one another along the third direction to form a second capacitor in series with the first capacitor.

In another aspect, a packaged electronic device includes a first semiconductor die having a first conductive feature, a second semiconductor die having a second conductive feature, and s capacitor die. The capacitor die includes a first dielectric layer above a semiconductor layer, and a lower-bandgap dielectric layer above the first dielectric layer, in which the lower-bandgap dielectric layer has a bandgap energy less than a bandgap energy of the first dielectric layer. The capacitor die includes a conductive first capacitor plate above the lower-bandgap dielectric layer in a first plane of orthogonal first and second directions, a second dielectric layer above the first capacitor plate, and a conductive second capacitor plate above the second dielectric layer in a second plane of the first and second directions. The first and second capacitor plates are spaced apart from one another along an orthogonal third direction to form a first capacitor. The capacitor die also includes a conductive third capacitor plate above the second dielectric layer in the second plane. The third capacitor plate is spaced apart from the second capacitor plate in the second plane, and the first and third capacitor plates spaced apart from one another along the third direction to form a second capacitor in series with the first capacitor. The packaged electronic device also includes a first electrical connection that couples the first conductive feature of the first semiconductor die to the second capacitor plate of the capacitor die, a second electrical connection that couples the second conductive feature of the second semiconductor die to the third capacitor plate of the capacitor die, a package structure that encloses the first semiconductor die, the second semiconductor die, the capacitor die, and the first and second electrical connections, and conductive leads exposed along one or more sides of the package structure.

In another aspect, a method of manufacturing an electronic device includes fabricating a capacitor die and separating the capacitor die from a wafer. The capacitor die fabrication includes forming a first dielectric layer above a semiconductor layer of a wafer, forming a lower-bandgap dielectric layer above the first dielectric layer, the lower-bandgap dielectric layer having a bandgap energy less than a bandgap energy of the first dielectric layer, forming a second dielectric layer above the first capacitor plate, and forming a conductive second capacitor plate and a conductive third capacitor plate above the second dielectric layer.

BRIEF DESCRIPTION OF THE DRAWINGS

FIGS. 6-22 are partial sectional side elevation views of the device of FIGS. 1-3 undergoing metallization structure fabrication processing according to the method of FIG. 5.

DETAILED DESCRIPTION

Figure 1:
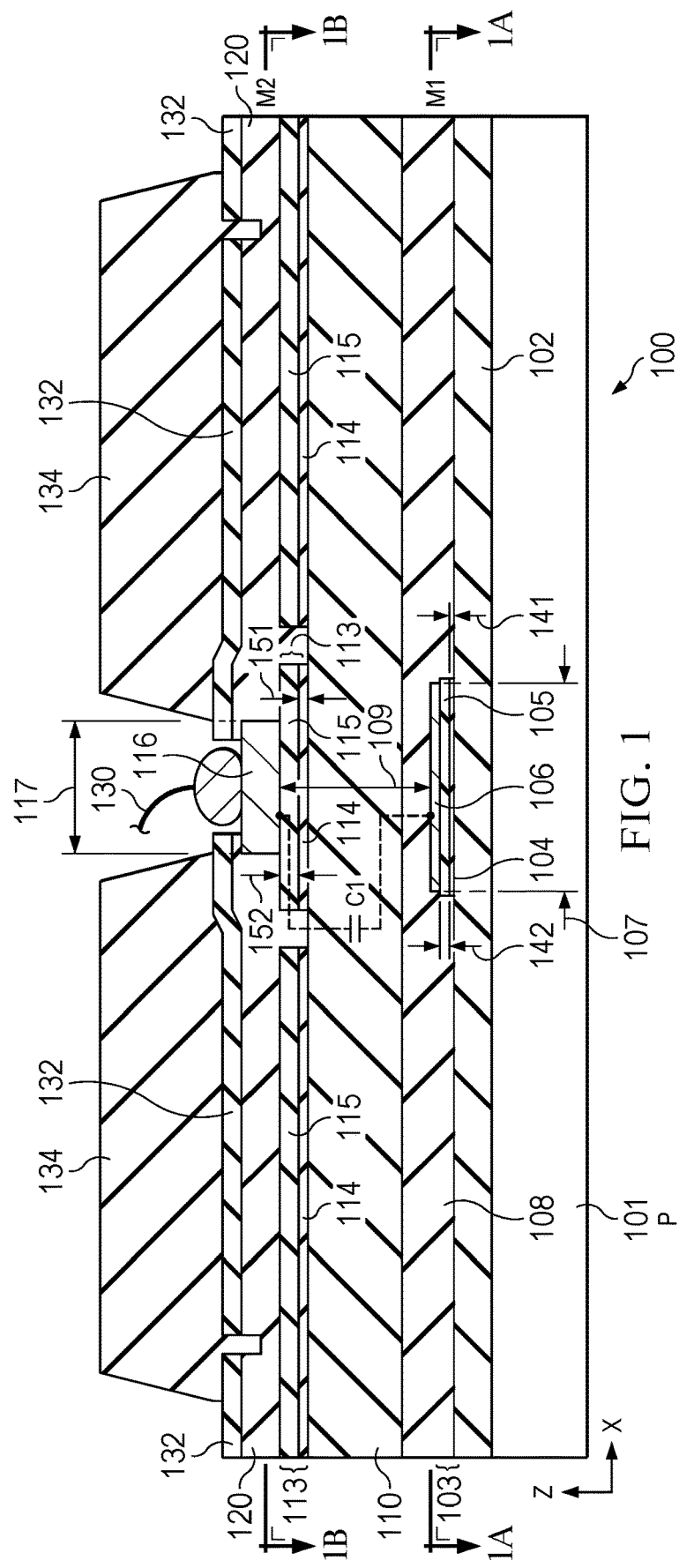
FIG. 1 is a partial sectional side elevation view of an electronic device having series connected isolation capacitors with a low-bandgap dielectric layer under a lower capacitor plate taken along line 1-1 of FIGS. 1A and 1B.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
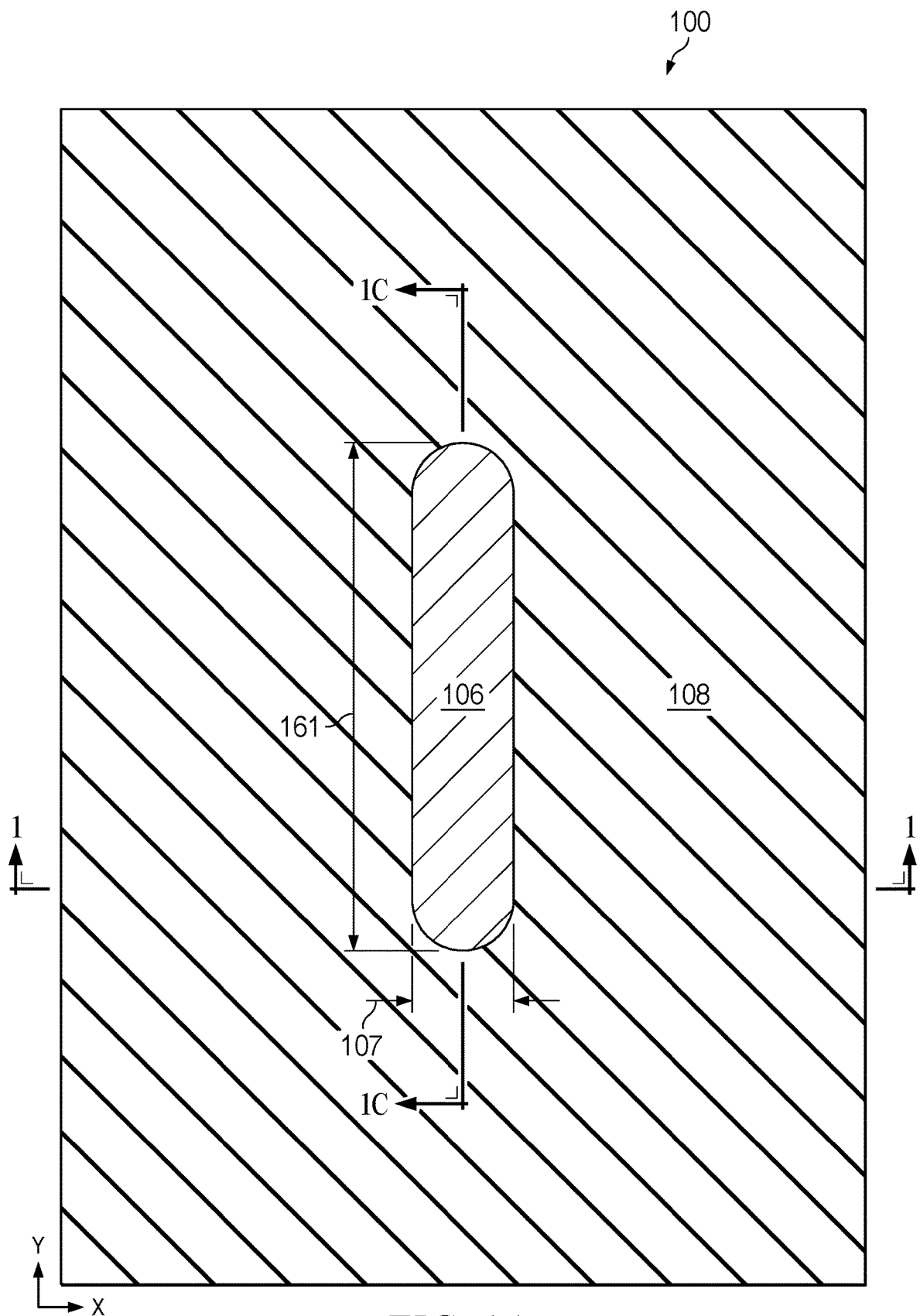
FIG. 1A is a partial sectional top plan view taken along line 1A-1A of FIG. 1.
Figure 1B:
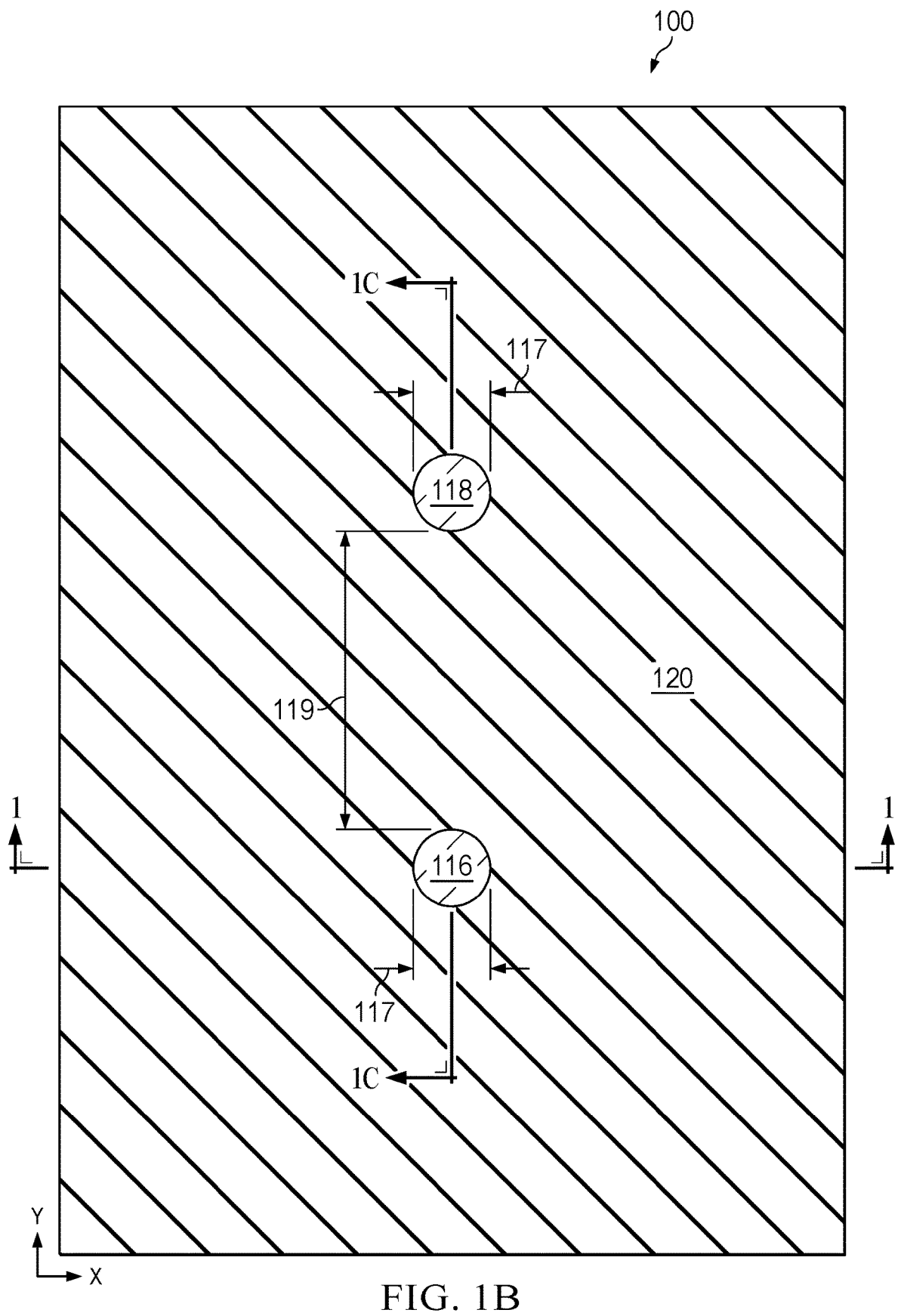
FIG. 1B is a partial sectional top plan view taken along line 1B-1B of FIG. 1.
Figure 1C:
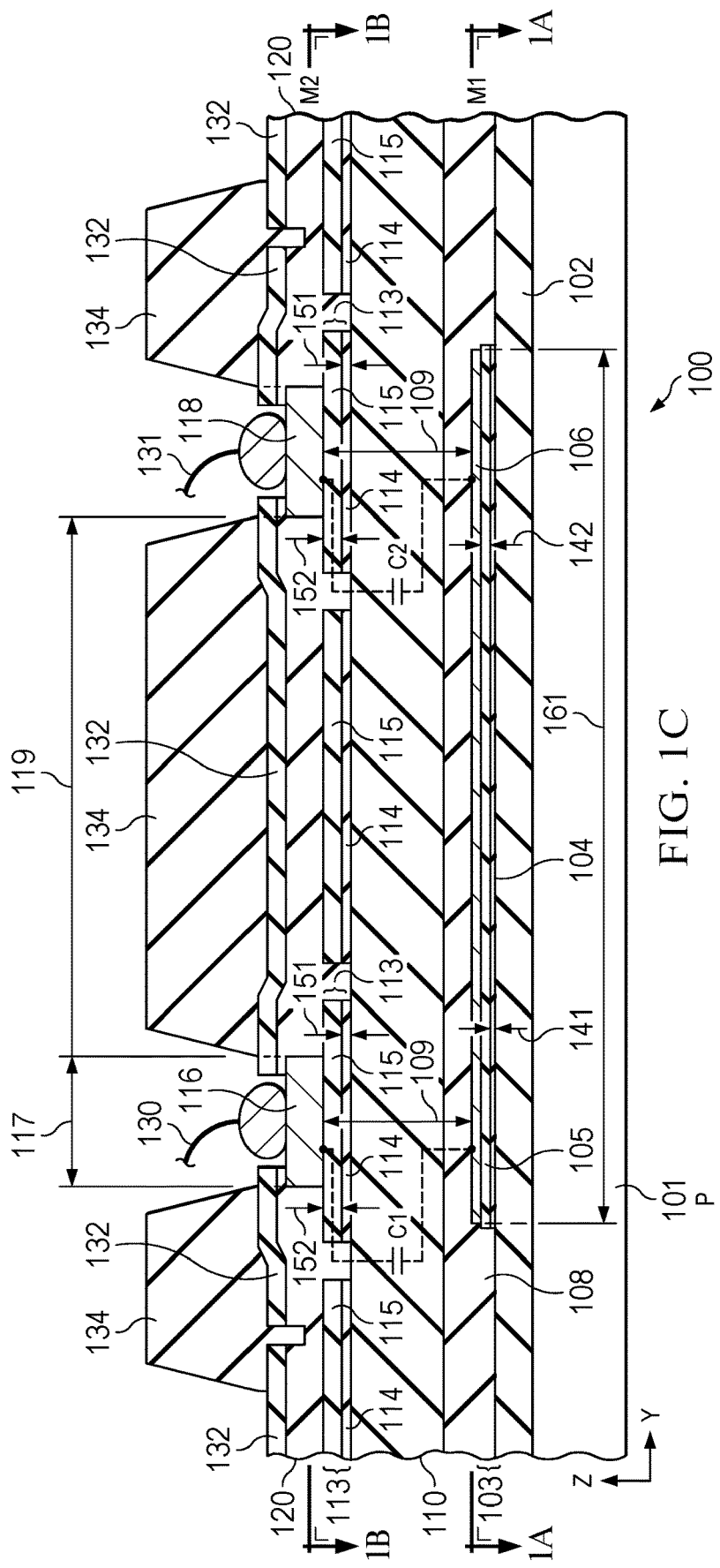
FIG. 1C is a partial sectional side elevation view taken along line 1C-1C of FIGS. 1A and 1B.
Figure 2:
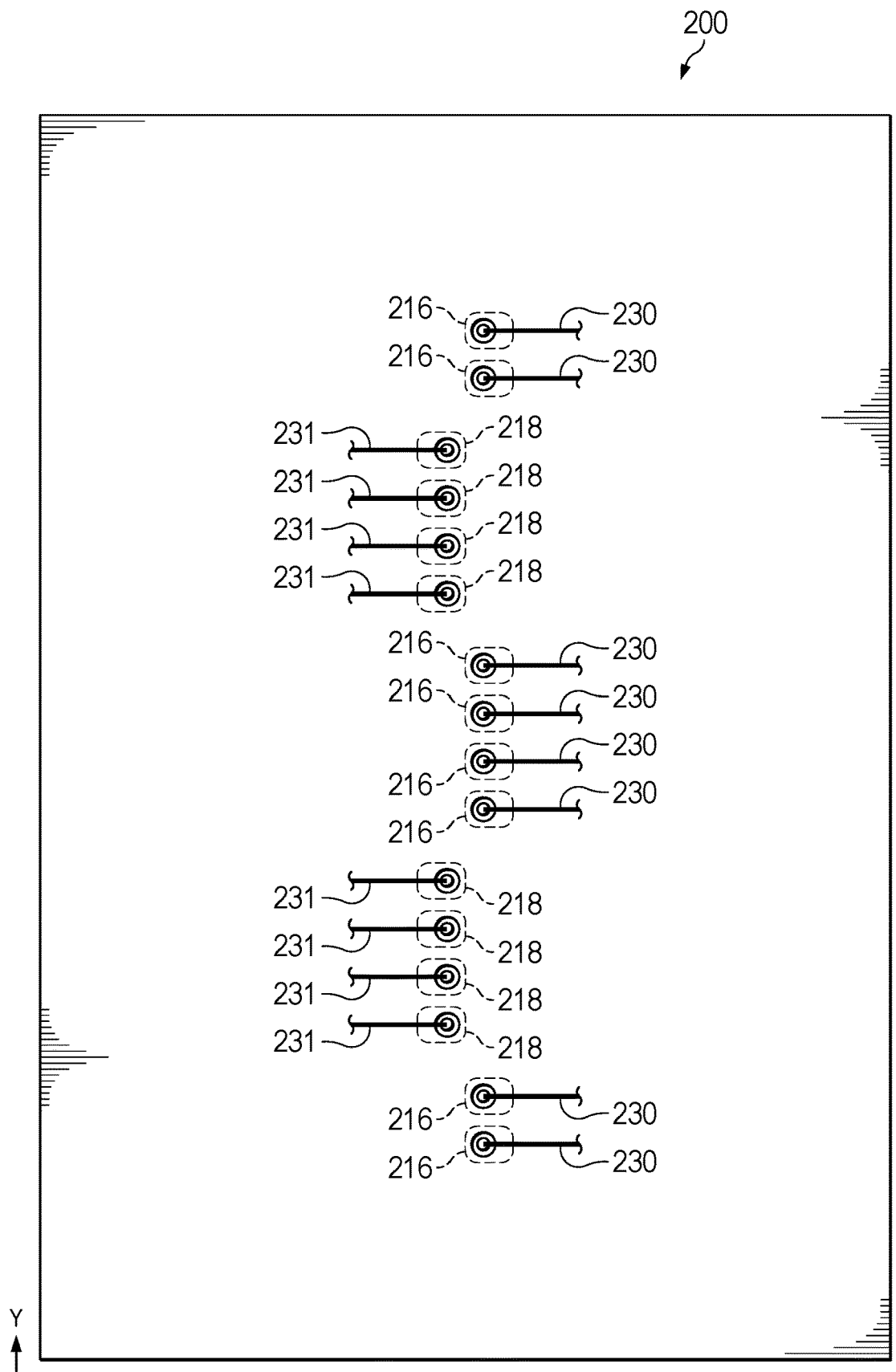
FIG. 2 is a sectional top plan view of another example electronic device with symmetrical upper capacitor plates.
Figure 3:
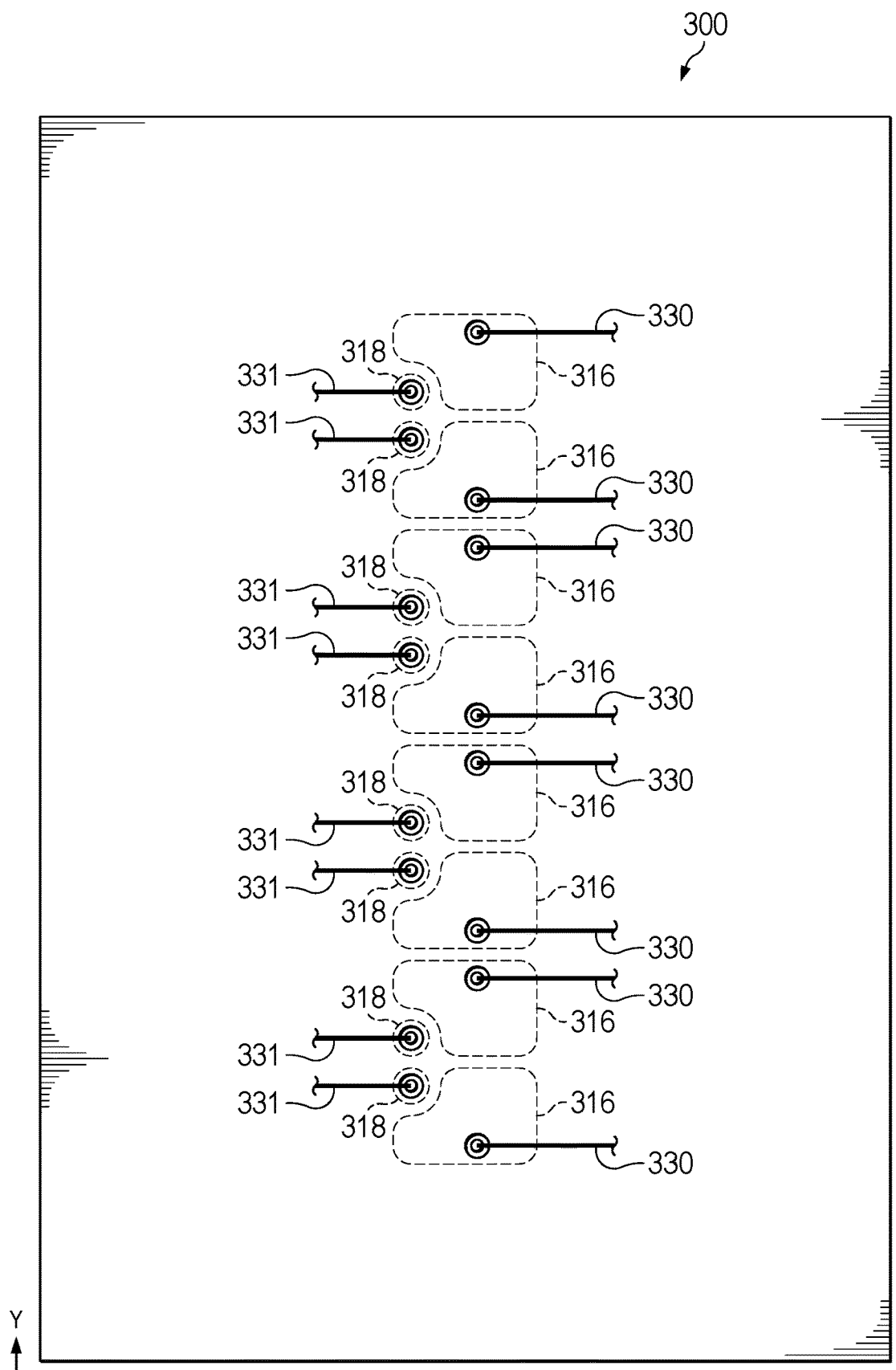
FIG. 3 is a sectional top plan view of another example electronic device with asymmetrical upper capacitor plates.

Referring initially to FIGS. 1-3, FIG. 1 shows a partial sectional side view of an electronic device 100, FIG. 1A shows a sectional top view taken along line 1A-1A of FIG. 1, FIG. 1B shows a sectional top plan view taken along line 1B-1B of FIG. 1 and FIG. 1C shows a sectional side view taken along line 1C-1C of FIGS. 1A and 1B. The drawings show the electronic device in an example orientation in a three-dimensional space having a first direction X, a second direction Y and a third direction Z, each of which is orthogonal to the other two, where references to a structure being above or over another structure or feature refer to the relative positions of the illustrated structures in the positive third direction Z when oriented in the illustrated position.

The electronic device 100 includes one or more electronic components, such as the illustrated capacitors and, optionally, other components such as further capacitors, transistors, resistors (not shown), which are fabricated on and/or in a semiconductor structure of a starting wafer, which is subsequently separated or singulated into individual semiconductor dies that are separately packaged to produce integrated circuit products. The electronic device 100 is a capacitor die in one example, which is packaged together with other semiconductor dies to provide a capacitive isolation barrier between circuitry of two other semiconductor dies in a multi-chip module as illustrated and described further below in connection with FIGS. 4 and 21.

As shown in FIGS. 1 and 1C, the electronic device 100 includes a semiconductor layer 101. In one example, the semiconductor layer 101 is or includes a p-type semiconductor material such as a silicon layer, a silicon-germanium layer, a silicon-on-insulator (an) structure, or another layer having semiconductor material. The electronic device 100 further includes a pre-metal dielectric (PMD) layer 102 above the semiconductor layer 101. In one example, the PMD layer 102 is directly on, and contacts, the semiconductor layer 101. In one example, the PMD layer 102 is or includes silicon dioxide (e.g., $SiO_2$) with a thickness of about 1.2 μm.

The electronic device 100 also includes a first lower-bandgap dielectric layer 103 above the first dielectric layer 102. In one example, the first lower-bandgap dielectric layer 103 is directly on, and contacts, the first dielectric layer 102. The first lower-bandgap dielectric layer 103 has a bandgap energy less than a bandgap energy of the first dielectric layer 102. The first lower-bandgap dielectric layer 103 in one example includes two or more sublayers. In the illustrated example, the first lower-bandgap dielectric layer 103 includes a first silicon oxynitride layer 104 above the first dielectric layer 102, and a first silicon nitride layer 105 above the silicon oxynitride layer 104. In one example, the first silicon oxynitride layer 104 is directly on, and contacts the first dielectric layer 102. In this or another example, the first silicon nitride layer 105 is directly on, and contacts the silicon oxynitride layer 104. In one implementation, the first silicon oxynitride layer 104 has a thickness 141 along the third direction Z of 3000 Å or less. In this or another example, the first silicon nitride layer 105 has a thickness 142 along the third direction Z of 1000 Å or less.

The electronic device 100 also includes a conductive first capacitor plate 106 above the first lower-bandgap dielectric layer 103 in a first plane of the respective first and second directions X and Y (a first X-Y plane in the illustrated orientation). In one example, the first capacitor plate 106 is directly on, and contacts, the first lower-bandgap dielectric layer 103. In the illustrated example, the conductive first capacitor plate 106 is above the silicon nitride layer 105 as shown in FIGS. 1 and 1C. In one example, the first capacitor plate 106 is directly on, and contacts, the silicon nitride layer 105. In these or another example, the first capacitor plate 106 is or includes aluminum. In the illustrated implementation, the first capacitor plate 106 forms a lower capacitor plate for two series-connected capacitors. In this example, the first capacitor plate 106 has a lateral width 107 in the first X-Y plane along the first direction X and has an elongated shape with a length 161 shown in FIG. 1A. The first capacitor plate 106 in this example is not electrically connected to the semiconductor layer 101. In operation, the voltage of the first capacitor plate 106 is floating with respect to a voltage of the semiconductor layer 101.

The first lower-bandgap dielectric layer 103 mitigates voltage breakdown in operation of the electronic device 100. In the illustrated example, the first lower-bandgap dielectric layer 103 is disposed between the first dielectric layer 102 and the first capacitor plate 106, contacting both. In this example, the first silicon oxynitride layer 104 extends between the first dielectric layer 102 and the first silicon nitride layer 105, contacting both. The first silicon nitride layer 105 in this example extends between the first silicon oxynitride layer 104 and the first capacitor plate 106, contacting both. The first silicon oxynitride layer 104 has a lower bandgap energy than the silicon dioxide-base dielectric material of the first dielectric layer 102, and the first silicon nitride layer 105 has a lower bandgap energy than the first silicon oxynitride layer 104. In one example, the first lower-bandgap dielectric layer 103 extends laterally past the edges of the first capacitor plate 106, continuously around the first capacitor plate 106, by a distance which is at least twice a thickness of the lower-bandgap dielectric layer 103. In another example, the first lower-bandgap dielectric layer 103 extends laterally along substantially the entire upper side of the first dielectric layer 102. In other implementations, the first lower-bandgap dielectric layer 103 includes a single dielectric layer with a bandgap energy less than the bandgap energy of the first dielectric layer 102. In other implementations, the first lower-bandgap dielectric layer 103 has more than two sub-layers. In these or other examples, the first lower-bandgap dielectric layer 103 includes one or more of the dielectric materials of Table 1.

TABLE 1

| Dielectric Material | Bandgap Range (electron volts) |
| --- | --- |
| silicon oxide nitride | ~7.5 |
| silicon nitride | 3.5 to ~6 |
| silicon oxide carbide nitride | higher than silicon carbide nitride |
| silicon carbide nitride | 3.8 to 4.7 |
| tantalum pentoxide | 3.8 to 5.3 |
| diamondlike carbon | 5.5 |
| titanium dioxide | 3.3 |
| aluminum nitride | 6.2 |
| aluminum oxide | 6.5 to 7.0 |
| silicon monoxide | lower than $SiO_2$ |
| zinc oxide | 3.4 |

Bandgaps of variable stoichiometry materials in Table 1 such as silicon oxide nitride, silicon oxide carbide nitride and silicon carbide nitride may vary, depending on a relative atomic fraction of oxygen, nitrogen and/or carbon. Silicon-containing dielectric materials which are silicon rich may provide poor performance as sub-layers of the first lower-bandgap dielectric layer 103 due to less-than-desired electrical impedance.

As further shown in FIGS. 1 and 1C, the electronic device 100 also includes a second dielectric layer 108, 110 above the first capacitor plate 106 having a thickness along the third direction Z set according to an operating voltage rating of the electronic device 100. In one example, the second dielectric layer includes a first interlevel dielectric (ILD) layer 108, such as $SiO_2$, above the first capacitor plate 106 and the exposed portions of the first dielectric layer 102, as well as another ILD dielectric layer 110, such as $SiO_2$, above the dielectric layer 108. In one implementation, the dielectric layer 108 is directly on, and contacts the top sides of the first capacitor plate 106 and the exposed portion of the first dielectric layer 102. In this or another example, the dielectric layer 110 is directly on, and contacts the top side of the dielectric layer 108.

The electronic device 100 also includes a conductive second capacitor plate 116 above the second dielectric layer 108, 110 in a second plane of the first and second directions X, Y. The first and second capacitor plates 106 and 116 are spaced apart from one another along the third direction Z by a first distance 109, such as approximately 9-11 µm, with intervening dielectric material (e.g., $SiO_2$) to form a first capacitor C1 as schematically indicated in FIGS. 1 and 1C. The second capacitor plate 116 has a lateral width 117 along the first direction X as shown in FIGS. 1 and 1B.

As best shown in FIGS. 1B and 1C, the electronic device 100 also includes a conductive third capacitor plate 118 above the second dielectric layer 108, 110 in the second X-Y plane. The third capacitor plate 118 is spaced apart from the second capacitor plate 116 in the second plane by a second distance 119 shown in FIG. 1C. In one example, the second distance 119 is greater than or equal to the first distance 109. The third capacitor plate 118 has the lateral width 117 along the first direction X as shown in FIG. 1B. The second and third capacitor plates 116 and 118 in one example are or include aluminum. The lateral width of the middle portion of the second lower-bandgap dielectric layer 113 along the first direction X is greater than the lateral width of the lower-bandgap dielectric layer 103 along the first direction X as shown in FIG. 1.

Figure 24:
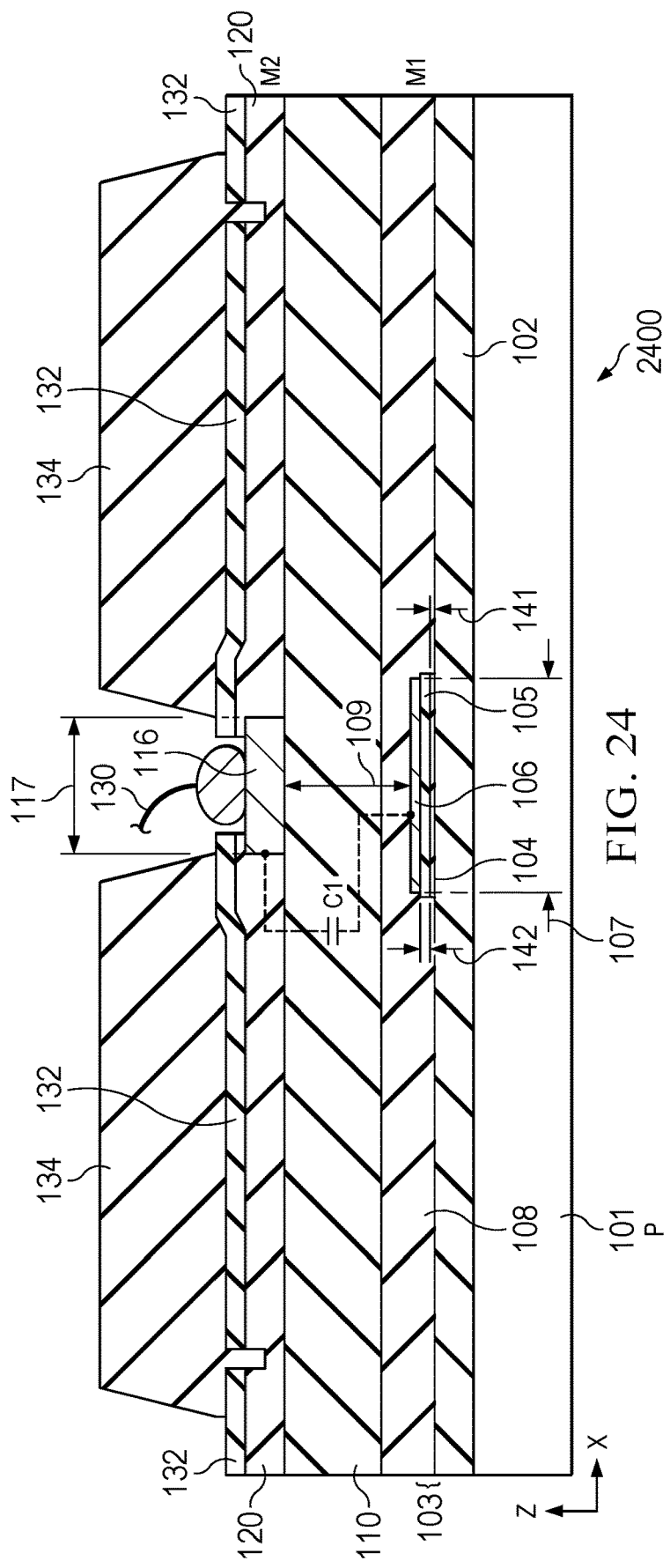
FIG. 24 is a partial sectional side elevation view of another electronic device having series connected isolation capacitors with low-bandgap dielectric layers under the lower capacitor plates.

The first and third capacitor plates 106, 118 are spaced apart from one another by the distance 109 in FIG. 1C along the third direction Z to form a second capacitor C2 that is in series with the first capacitor C1. The electronic device 100 in the example of FIGS. 1-1C also includes a second lower-bandgap dielectric layer 113 above the second dielectric layer 108, 110, and the second and third capacitor plates 116 and 118 are above the second lower-bandgap dielectric layer 113. In this example, the second lower-bandgap dielectric layer 113 is directly on, and contacts the dielectric layer 110, and the second and third capacitor plates 116 and 118 are directly on and contact the second lower-bandgap dielectric layer 113. In another implementation, the second lower-bandgap dielectric layer 113 is omitted, as shown below in connection with FIG. 24. The second lower-bandgap dielectric layer 113 in FIGS. 1-1C includes a second silicon oxynitride layer 114 above the second dielectric layer 108, 110, and a second silicon nitride layer 115 above the second silicon oxynitride layer 114, and the second capacitor plate 116 is above the second silicon nitride layer 115. In one example, the second silicon oxynitride layer 114 has a thickness 151 along the third direction Z that is greater than the thickness 141 of the first silicon oxynitride layer 104 along the third direction Z. In one example, the thickness 151 of the second silicon oxynitride layer 114 is 200 to 600 nm. The second silicon nitride layer 115 in this or another example has a thickness 152 along the third direction Z that is greater than the thickness 142 of the silicon nitride layer 105 along the third direction Z. In one example, the thickness 152 of the second silicon nitride layer 115 is 200 to 600 nm.

The second lower-bandgap dielectric layer 113 has a bandgap energy less than a bandgap energy of the second dielectric layer 108, 110. The second lower-bandgap dielectric layer 113 in one example includes two or more sublayers. In the illustrated example, the second lower-bandgap dielectric layer 113 includes the second silicon oxynitride layer 114 above the second dielectric layer 108, 110, and the second silicon nitride layer 115 above the silicon oxynitride layer 114. In one example, the second silicon oxynitride layer 114 is directly on, and contacts the dielectric layer 110. In this or another example, the second silicon nitride layer 115 is directly on, and contacts the second silicon oxynitride layer 114.

The second lower-bandgap dielectric layer 113 also mitigates voltage breakdown in operation of the electronic device 100. In the illustrated example, the second lower-bandgap dielectric layer 113 is disposed between the second dielectric layer 108, 110 and the second capacitor plate 116, contacting both. In this example, the second silicon oxynitride layer 114 extends between the second dielectric layer 108, 110 and the second silicon nitride layer 115, contacting both. The second silicon nitride layer 115 in this example extends between the second silicon oxynitride layer 114 and the second capacitor plate 116, contacting both. The second silicon oxynitride layer 114 has a lower bandgap energy than the silicon dioxide-base dielectric material of the second dielectric layer 108, 110, and the second silicon nitride layer 115 has a lower bandgap energy than the second silicon oxynitride layer 114. In one example, the second lower-bandgap dielectric layer 113 extends laterally past and continuously around the edges of the second and third capacitor plates 116 and 118, by a distance which is at least twice a thickness of the second lower-bandgap dielectric layer 113. In other implementations, the second lower-bandgap dielectric layer 113 includes a single dielectric layer with a bandgap energy less than the bandgap energy of the second dielectric layer 108, 110. In other implementations, the second lower-bandgap dielectric layer 113 has more than two sub-layers. In these or other examples, the second lower-bandgap dielectric layer 113 includes one or more of the dielectric materials of Table 1 above.

The electronic device 100 of FIGS. 1-1C includes a protective overcoat (PO) structure having a bilayer structure with an oxide layer 120 (e.g., $SiO_2$) and a silicon oxynitride layer 132 (e.g., SiON). The oxide layer 120 in one example has a thickness of approximately 1.5 µm and extends above the dielectric layer 110, the lateral extensions of the second lower-bandgap dielectric layer 113 and outer portions of the top side of the second and third capacitor plates 116 and 118. In one example, the oxide layer 120 is directly on, and contacts the dielectric layer 110, the lateral extensions of the second lower-bandgap dielectric layer 113 and the outer portions of the top sides of the respective second and third capacitor plates 116 and 118. The silicon oxynitride layer 132 extends above the oxide layer 120. In one example, the silicon oxynitride layer 132 is directly on, and contacts the oxide layer 120.

The illustrated example also includes a polyimide layer 134 above a portion of the silicon oxynitride layer 132. In one example, the polyimide layer 134 is directly on, and contacts the silicon oxynitride layer 132. The polyimide layer 134 in the illustrated example extends downward into slots formed in the layers 120 and 132 as shown in FIGS. 1 and 1C. The polyimide layer 134 in one example provides a stress barrier to mitigate mechanical stress on the semiconductor layer 101 and the capacitors C1 and C2 following enclosure in a molded packaging structure, for example, to mitigate mechanical stress between the overlying mold compound and the surface of the dielectric layer 120 that could potentially delaminate after some number of temperature cycling events.

Portions of the top sides of the second and third capacitor plates 116 and 118 are exposed through corresponding openings in the layers to allow electrical connection, for example, by bond wires 130 and 131 shown in FIGS. 1 and 1C to connect the capacitors C1 and C2 to respective external components (e.g., another die or a conductive feature of a lead frame, not shown). In the example electronic device 100 of FIGS. 1-1C provides series-connected capacitors C1 and C2 for providing electrical isolation between high and low voltage domain circuits, for example, for transferring a transmit or receive signal.

FIGS. 2 and 3 show top views of other examples in which an electronic device includes multiple sets or pairs of series connected first and second capacitors that share a respective conductive first (e.g., lower) capacitor plate 106 above a lower-bandgap dielectric layer 103 and other similar structures, layers and dimensional relationships (e.g., 101-105, 107-110, 113-115, 117, 119, 120, 132 and 134) as illustrated and described above in connection with FIGS. 1-1C. FIG. 2 shows another example electronic device 200 with 8 pairs of series connected capacitors in a standalone capacitor device, including symmetrical upper capacitor plates 216 and 218 and corresponding bond wire connections 230 and 231. FIG. 3 shows another example electronic device 200 with 8 pairs of series connected capacitors in a standalone capacitor device, including asymmetrical upper capacitor plates 316 and 318 and corresponding bond wire connections 330 and 331, where the larger plates 316 are connected to high voltage circuitry and the smaller upper plates 318 are connected to lower voltage circuits.

Figure 4:
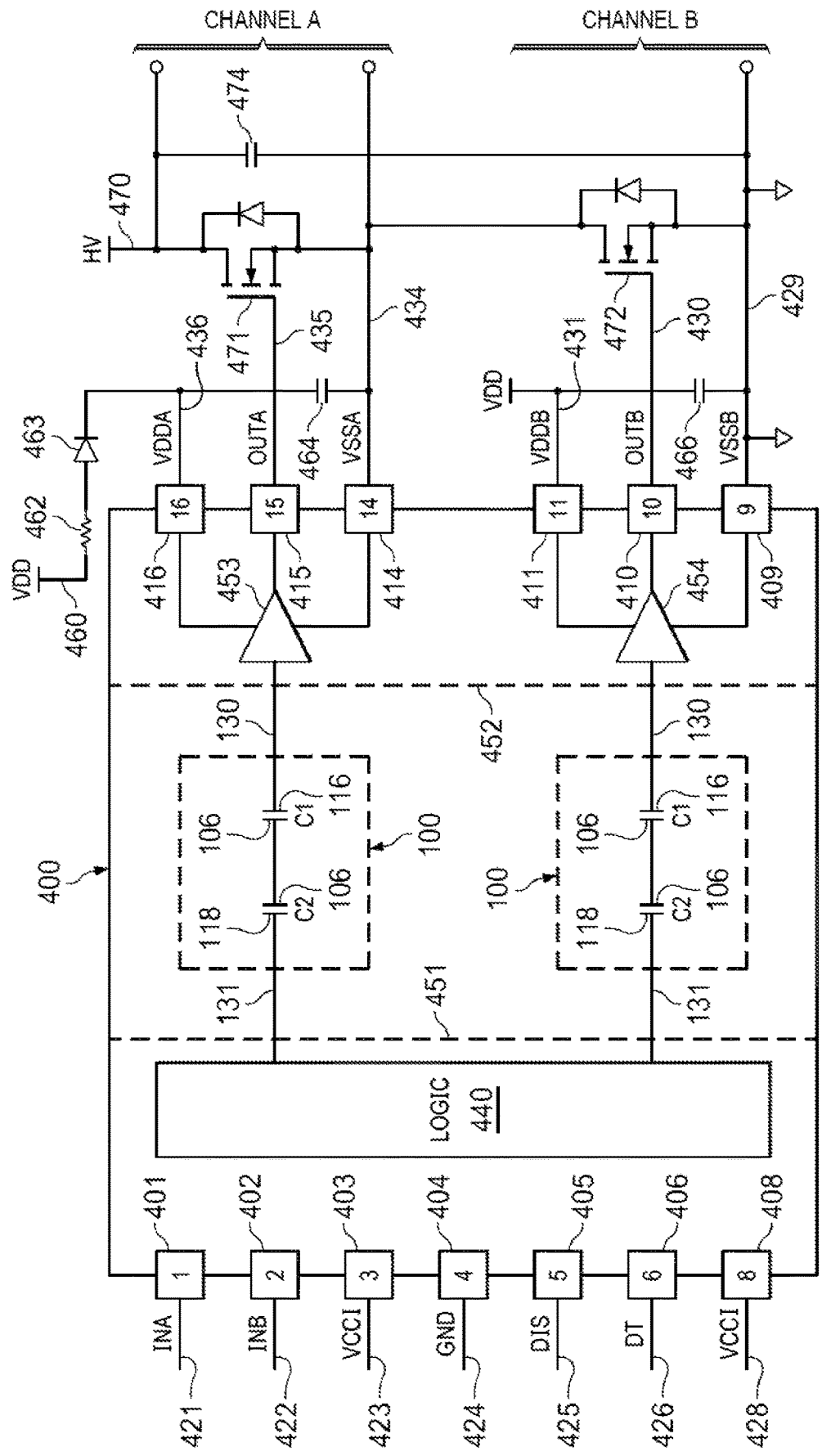
FIG. 4 is a schematic diagram of a packaged electronic device including two instances of the electronic device of FIGS. 1-1C.

FIG. 4 shows an example multi-chip module packaged electronic device 400 that includes two instances singulated or separated semiconductor dies as depicted and described above in connection with the electronic device 100 of FIGS. 1-1C. Each of the electronic devices 100 is referred to as a capacitor die that includes a first capacitor C1 with an upper capacitor plate 116 and a second capacitor C2 with an upper capacitor plate 118, and a shared first (e.g., lower) capacitor plate 106 as described above. The capacitor dies 100 are packaged together with a first semiconductor die 451 having a first conductive feature, and a second semiconductor die 452 having a second conductive feature. The packaged electronic device 400 includes conductive leads or terminals 401, 402, 403, 404, 405, 406, 408 associated with a first (e.g., low voltage) voltage domain, and conductive leads or terminals 409, 410, 411, 414, 415 and 416 associated with one or more additional (e.g., higher voltage) voltage domains. As schematically shown in FIG. 4, the electronic device 100 (e.g., the first semiconductor die) includes a pair of capacitors C1 and C2, each having a first terminal 116 and a second terminal 118 connected (e.g., wire bonded) to a corresponding bond wire 130, 131. In a corresponding user application (e.g., a communication system printed circuit board), the terminals 401-406, 408-411 and 414-416 are soldered to corresponding circuit board traces 421-426, 428-431 and 434-436 to provide electrical interconnection and operation with associated signal lines or signals INA, INB, VCCI, GND, DIS, DT, VCCI, VSSB, OUTB, VDDB, VSSA, OUTA and VDDA, respectively. The first die 451 in this example includes a logic circuit 440 that provides low voltage first and second communication channel signals to the first terminals 116 of the respective capacitors C1.

The series connected capacitors C1 and C2 of each capacitor die 100 provide an isolation barrier between the logic circuit 440 and capacitively coupled circuits of the second semiconductor die 452 of the packaged electronic device 400. The respective bond wires 130 and 131 are wire bonded to the exposed top sides of the second and third capacitor plates 116 and 118 to provide series connected capacitor coupling between the logic circuit 440 and respective drivers 453 and 454 of the second semiconductor die 452. The second semiconductor die 452 in one example is a receiver of the packaged electronic device 400 with output from the respective drivers 453 and 454 connected to external circuitry that controls a voltage VSSA at a switching node 434.

A first receiver output channel (e.g., channel "A") in FIG. 4 provides a first channel driver output biased to a supply voltage VDD received at a supply node 460. The supply node 460 is connected through a boot resistor 462 and a diode 463 to provide a first supply voltage signal VDDA at the circuit board trace 436. The first driver 453 receives the first supply voltage VDDA as an upper rail supply, and a lower rail of the driver 453 is connected to the circuit board trace 434 to operate at a reference voltage VSSA. The external circuitry includes a boot capacitor 464 connected between the terminals 414 and 416, and the output of the driver 453 is connected to the terminal for 15 to provide a first gate drive output. A second receiver output channel (e.g., channel "B") includes the second driver 454 of the second semiconductor die 452, which is biased according to the supply voltage VDD and a ground reference voltage VSSB at the terminals 411 and 409, respectively. The external circuitry also includes a supply voltage capacitor 466 connected between the supply voltage VDD and the ground reference voltage VSSB at the ground reference node 429. In operation, the drivers 453 and 454 operate according to signals received through the isolated capacitively coupled channels from the logic circuit 440 and provide respective gate drive signals OUTA and OUTB connected to gates of respective high side and low side transistors 471 and 472. The high side transistor 471 has a drain terminal 470 connected to a high-voltage supply voltage HV, and a capacitor 474 is connected between the drain terminal 470 and the ground reference node 429. The source terminal of the high side transistor 471 and the drain terminal of the low side transistor 472 are connected to the switching node 434.

Referring now to FIGS. 5-22, FIG. 5 shows a method 500 for fabricating a packaged electronic device. FIGS. 6-22 show the electronic device 100 of FIGS. 1-1C and the multi-chip module packaged electronic device 400 of FIG. 4 undergoing fabrication processing according to the method 500. The method 500 begins with fabricating a capacitor die 100, including front end processing at 502, for example, providing a starting wafer with the semiconductor layer 101. In the electronic device 100 of FIG. 1, the front-end processing at 502 includes processing of a starting semiconductor wafer, such as a p-type silicon wafer, a SOI structure with a silicon layer, a silicon-germanium layer, or another layer 101 having semiconductor material. At 504, the method 500 includes forming a first dielectric layer above a semiconductor layer of the wafer. FIG. 6 shows one example of the processing at 504, in which a deposition process 600 is performed that deposits the first (e.g., PMD) dielectric layer 102 (e.g., $SiO_2$) directly on the semiconductor layer 101. In one example, the process 600 deposits silicon dioxide to form the dielectric layer 102 to a thickness of about 10-15 μm.

The method 500 continues at 506 with forming a first lower-bandgap dielectric layer above the first dielectric layer 102, the lower-bandgap dielectric layer having a bandgap energy less than a bandgap energy of the first dielectric layer 102. FIGS. 7 and 8 shows one example, in which deposition processes 700 and 800 are performed that deposit the first lower-bandgap dielectric layer 103 above (e.g., directly on) the first dielectric layer 102. As discussed above, the deposited first lower-bandgap dielectric layer 103 forms a material that has a bandgap energy less than the bandgap energy of the first dielectric layer 102 (e.g., a single or multilayer structure including one or more of the materials in Table 1 above). In the illustrated example, the deposition process 700 of FIG. 7 is performed at 506 in FIG. 5 to form the first silicon oxynitride layer 104 to the thickness 141 above (e.g., directly on) the top side of the first dielectric layer 102. In one example, the deposition process 700 is a plasma enhanced chemical vapor (PECVD) process using bis (tertiary-butylamino) silane (BTBAS) and TEOS. Atomic fractions of nitrogen and oxygen in the first silicon oxynitride 104 may be selected by adjusting relative gas flows of the BTBAS and TEOS, respectively. In FIG. 8, a deposition process 800 is performed that forms the first silicon nitride layer 105 to the thickness 142 above (e.g., directly on) the top side of the first silicon oxynitride layer 104. In one example, the deposition process 800 is a PECVD process using BTBAS.

At 510, the method continues with forming a conductive first capacitor plate above the first lower-bandgap dielectric layer. FIG. 9 shows one example, in which a deposition process 900 is performed that deposits aluminum and selectively etches portions of the deposited aluminum to form the first capacitor plate 106 above (e.g., directly on) the first lower-bandgap dielectric layer 103. Exposed portions of the first lower-bandgap dielectric layer 103 in one example are selectively removed in one example by over etching of the aluminum etch process as shown in FIG. 9.

The method 500 continues at 512 and 514 with forming a second dielectric layer above the first capacitor plate. FIGS. 10 and 11 show one example, in which a bilayer second dielectric layer is formed on the first capacitor plate 106 and the exposed portions of the first lower-bandgap dielectric layer 103. A deposition process 1000 in FIG. 10 deposits the dielectric layer 108 (e.g., ILD layer, $SiO_2$) above (e.g., directly on) the first silicon nitride layer 105 at 512 in FIG. 5. A deposition process 1100 in FIG. 11 deposits the further dielectric layer 110 (e.g., ILD layer, $SiO_2$) above (e.g., directly on) the dielectric layer 108 (514 in FIG. 5).

Figure 12:
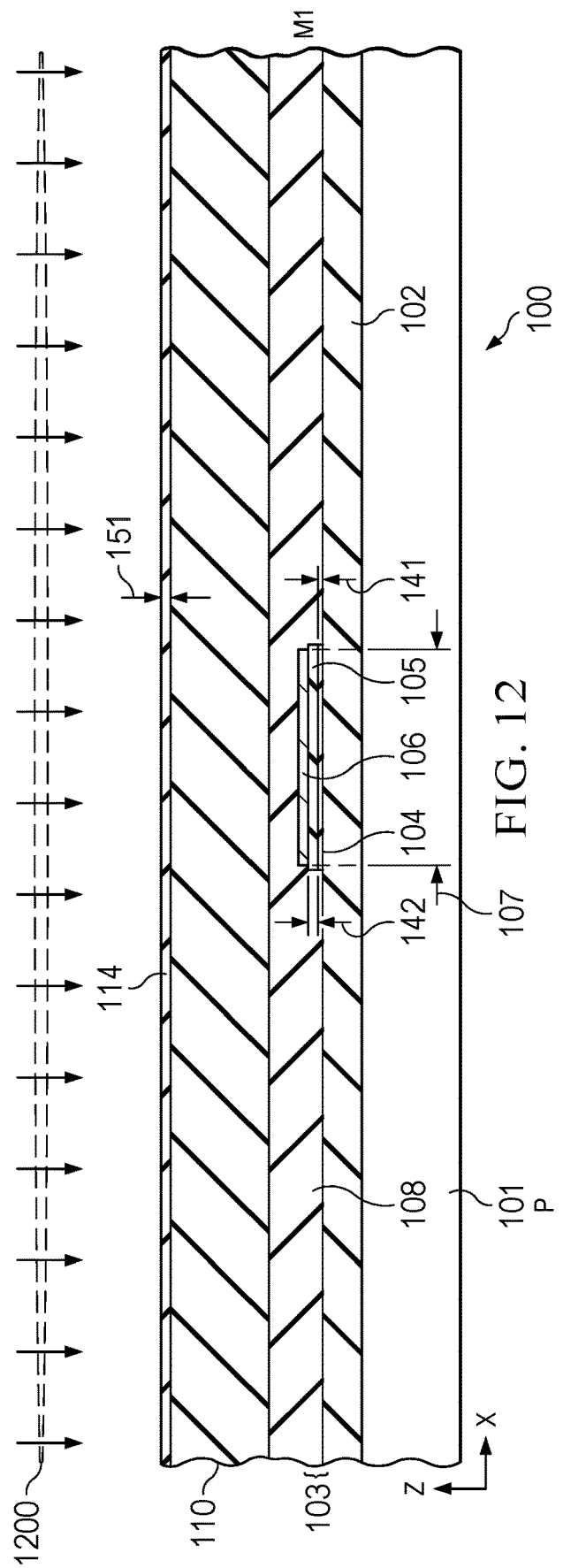
Figure 13:
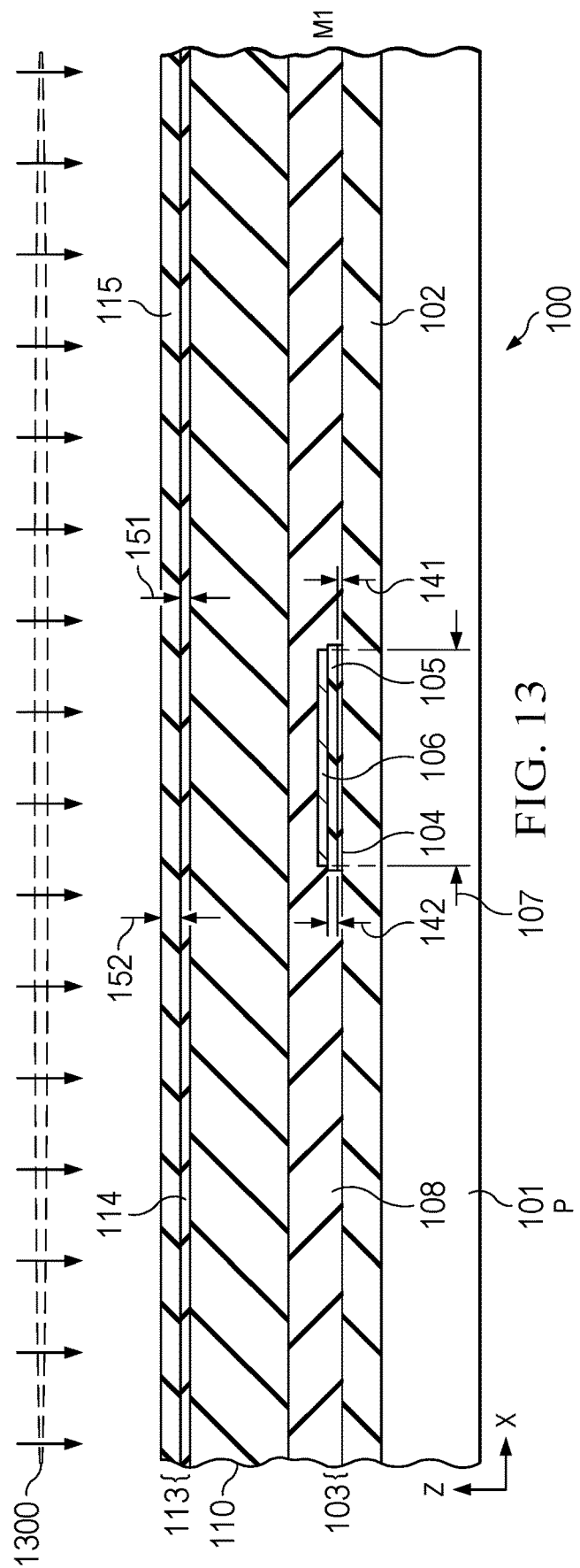

At 516, the method includes forming a second lower-bandgap dielectric layer above the second dielectric layer, where the second lower-bandgap dielectric layer has a bandgap energy less than a bandgap energy of the second dielectric layer 108, 110. FIGS. 12 and 13 shows one example, in which deposition processes 1200 and 1300 are performed that deposit the second lower-bandgap dielectric layer 113 above (e.g., directly on) the second dielectric layer 108, 110. The deposition process 1200 of FIG. 12 is performed at 516 in FIG. 5 to form the second silicon oxynitride layer 114 to the thickness 151 above (e.g., directly on) the top side of the dielectric layer 110. In one example, the deposition process 1200 is a plasma enhanced chemical vapor (PECVD) process using bis (tertiary-butylamino) silane (BTBAS) and TEOS. Atomic fractions of nitrogen and oxygen in the second silicon oxynitride 114 may be selected by adjusting relative gas flows of the BTBAS and TEOS, respectively. In FIG. 13, a deposition process 1300 is performed that forms the second silicon nitride layer 115 above (e.g., directly on) the top side of the second silicon oxynitride layer 114 to the thickness 152. In one example, the deposition process 1400 is a PECVD process using BTBAS.

The method 500 in one example continues at 519 with patterning the second lower-bandgap dielectric layer 113, for example, using an etch mask and an etch process (not shown).

Figure 5:
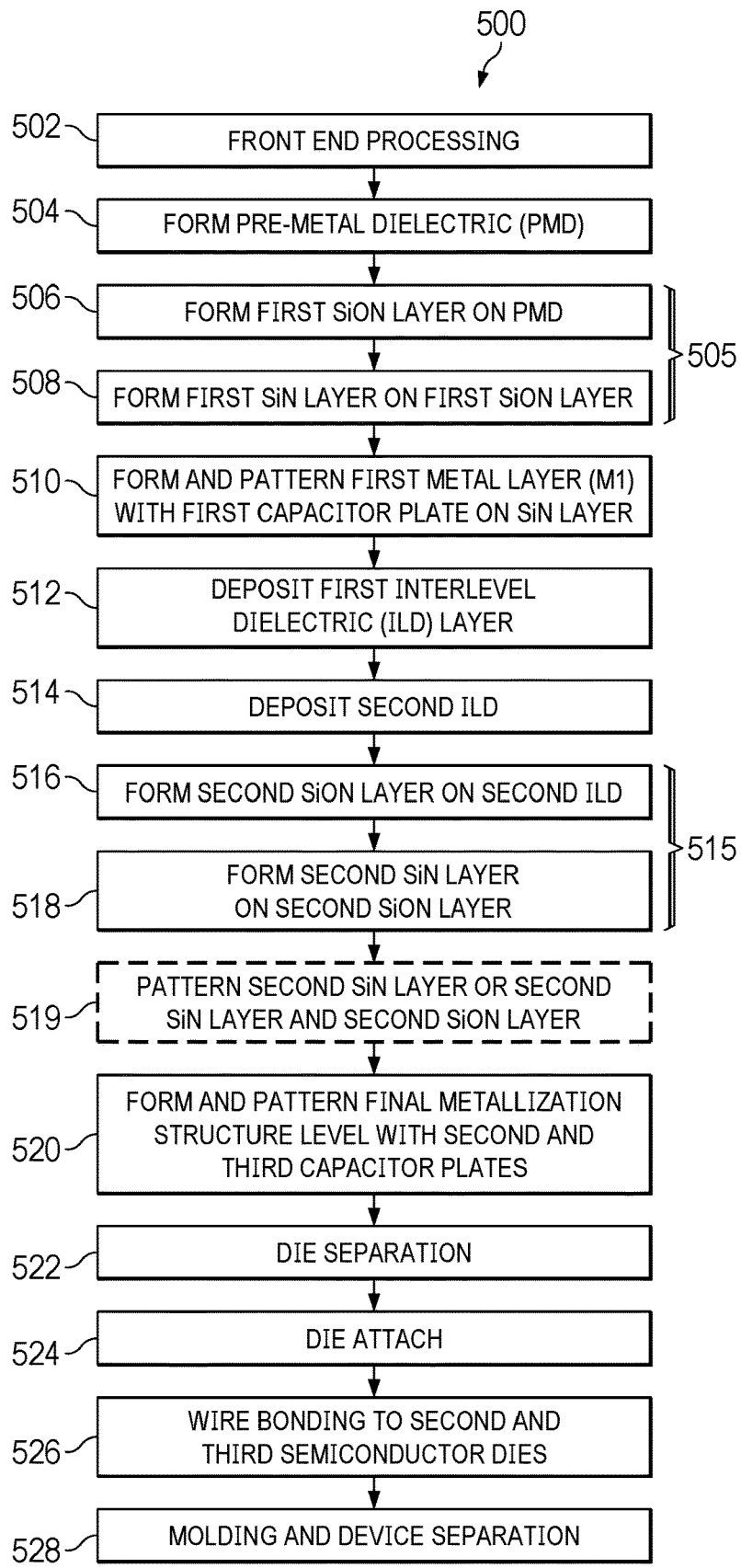
FIG. 5 is a flow diagram of a method of fabricating a packaged electronic device.
Figure 14:
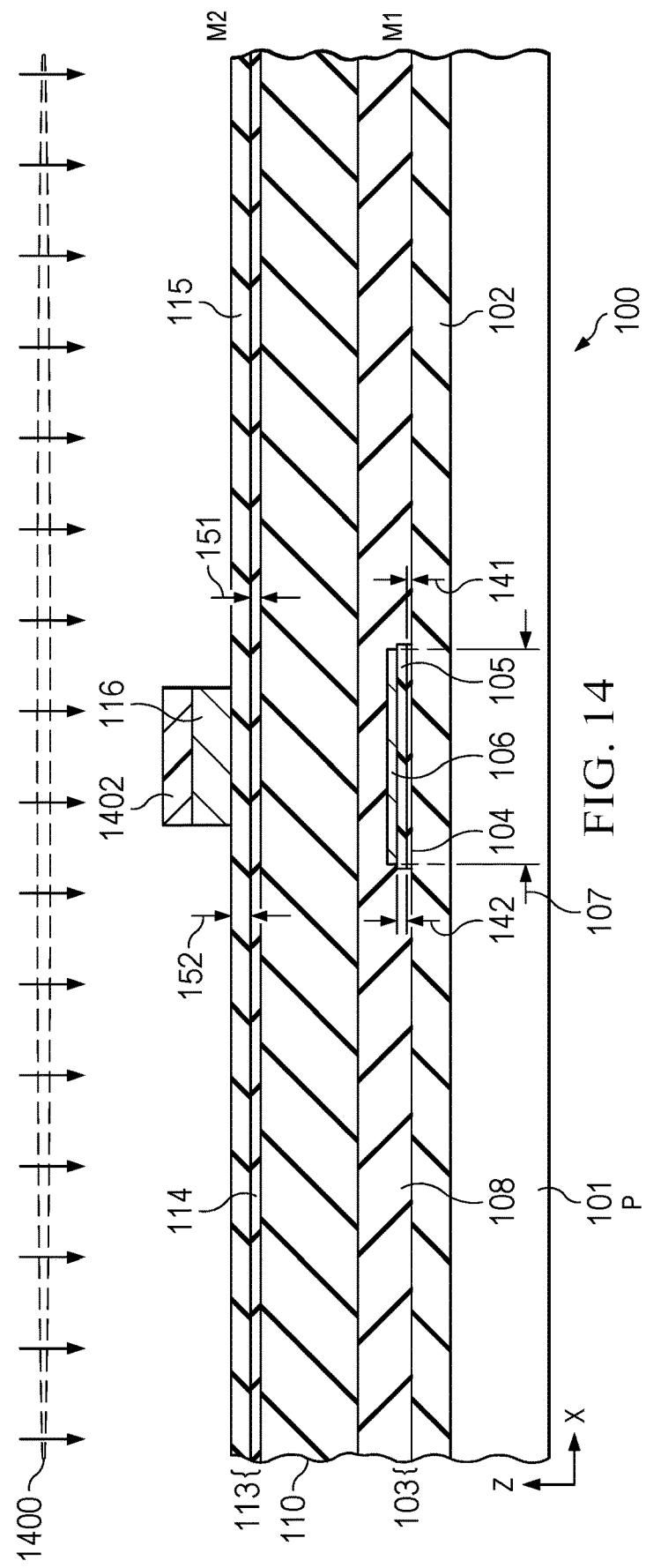
Figure 15:
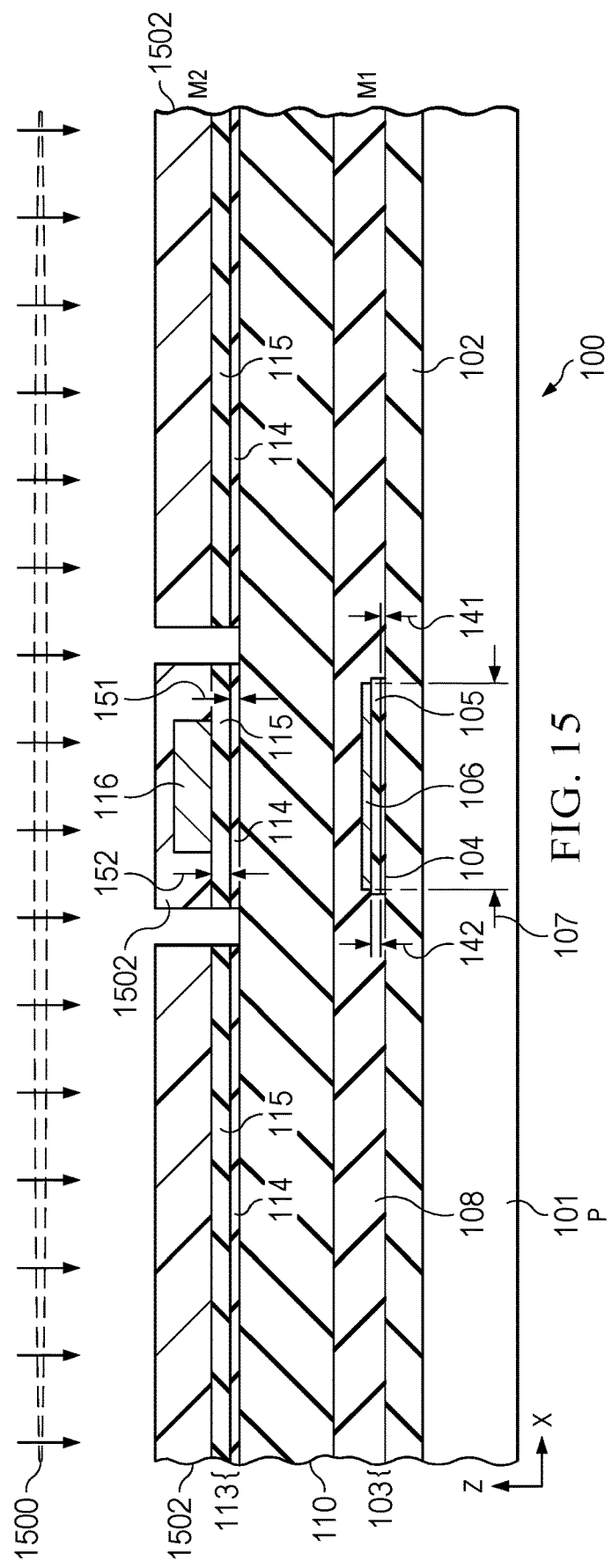

At 520 in FIG. 5, the method 500 includes forming the second capacitor plate 116 and the third capacitor plate 118 above the second lower-bandgap dielectric layer 113. FIG. 14 shows one example, in which a process 1400 is performed that that deposits aluminum and selectively etches portions of the deposited aluminum using a mask 1402 to form the second capacitor plate 116 above (e.g., directly on) the second lower-bandgap dielectric layer 113. In one example, the etching is continued so as to remove the exposed portions of the sublayers 114 and 115 of the second lower-bandgap dielectric layer 113. FIG. 15 shows another example, in which an etch process 1500 is performed with a second (e.g., wider) etch mask 1502 to selective remove exposed portions of the sublayers 114 and 115 of the second lower-bandgap dielectric layer 113 in a trench area laterally outward of the second a third capacitor plates 116 and 118.

In another example (e.g., the device in FIG. 24 below), the processing at 516, 518 and 519 is omitted, and the conductive second and third capacitor plates 116 and 118 are formed at 520 above (e.g., directly on) the second dielectric layer 108, 110.

Figure 16:
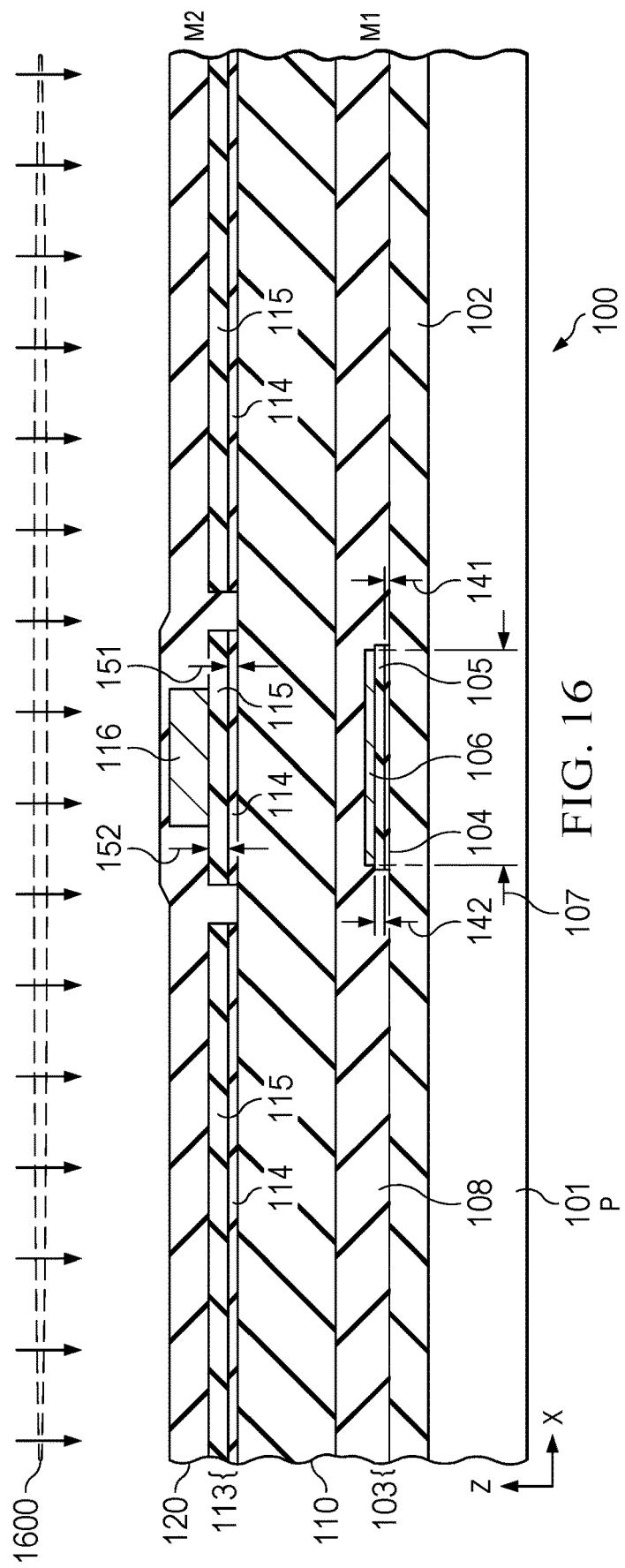
Figure 17:
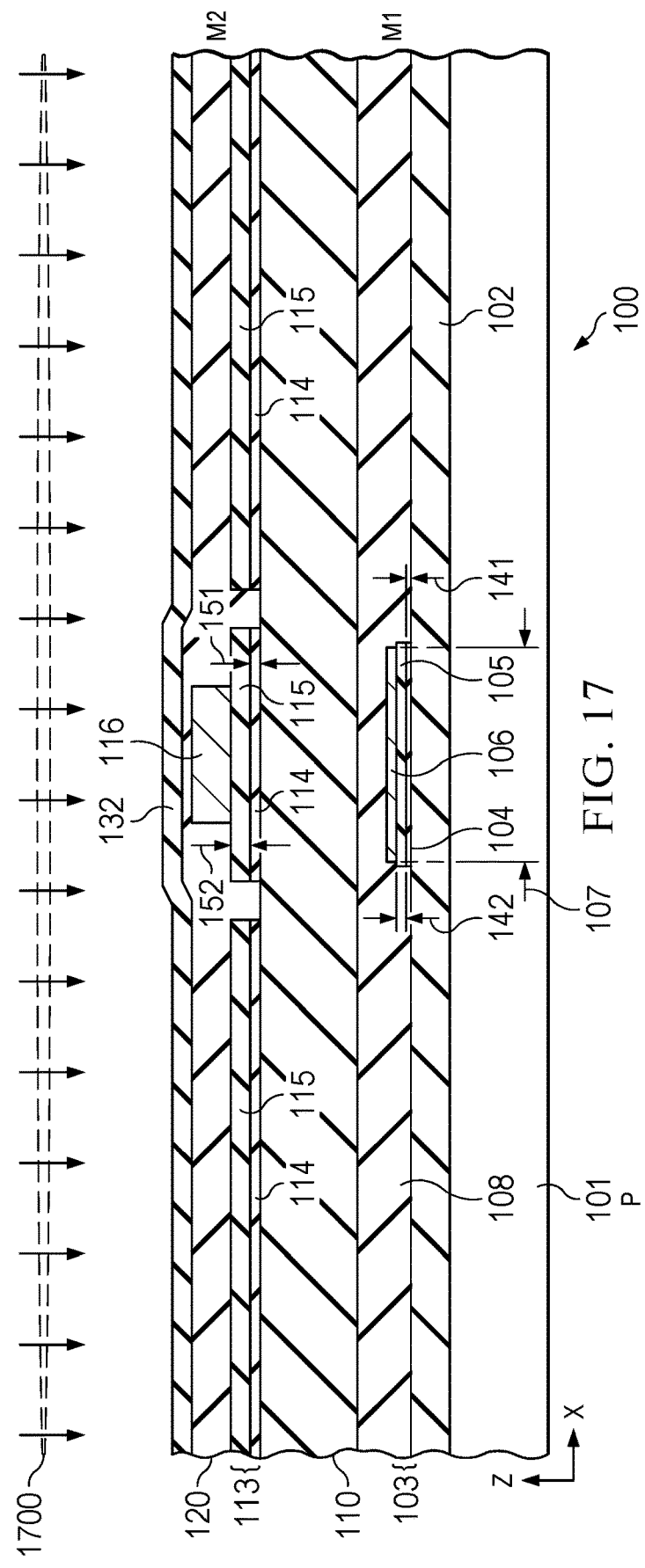

In addition, at 520, the upper metallization structure is completed, as shown in FIGS. 16-19. FIG. 16 shows one example, in which a deposition process 1600 is performed that forms the oxide layer 120 (e.g., $SiO_2$) above (e.g., directly on) the dielectric layer 110, the lateral extensions of the second lower-bandgap dielectric layer 113 and the outer portions of the top sides of the respective second and third capacitor plates 116 and 118. In FIG. 17, a deposition process 1700 is performed that forms the silicon oxynitride layer 132 (e.g., SiON) above (e.g., directly on) the oxide layer 120.

Figure 18:
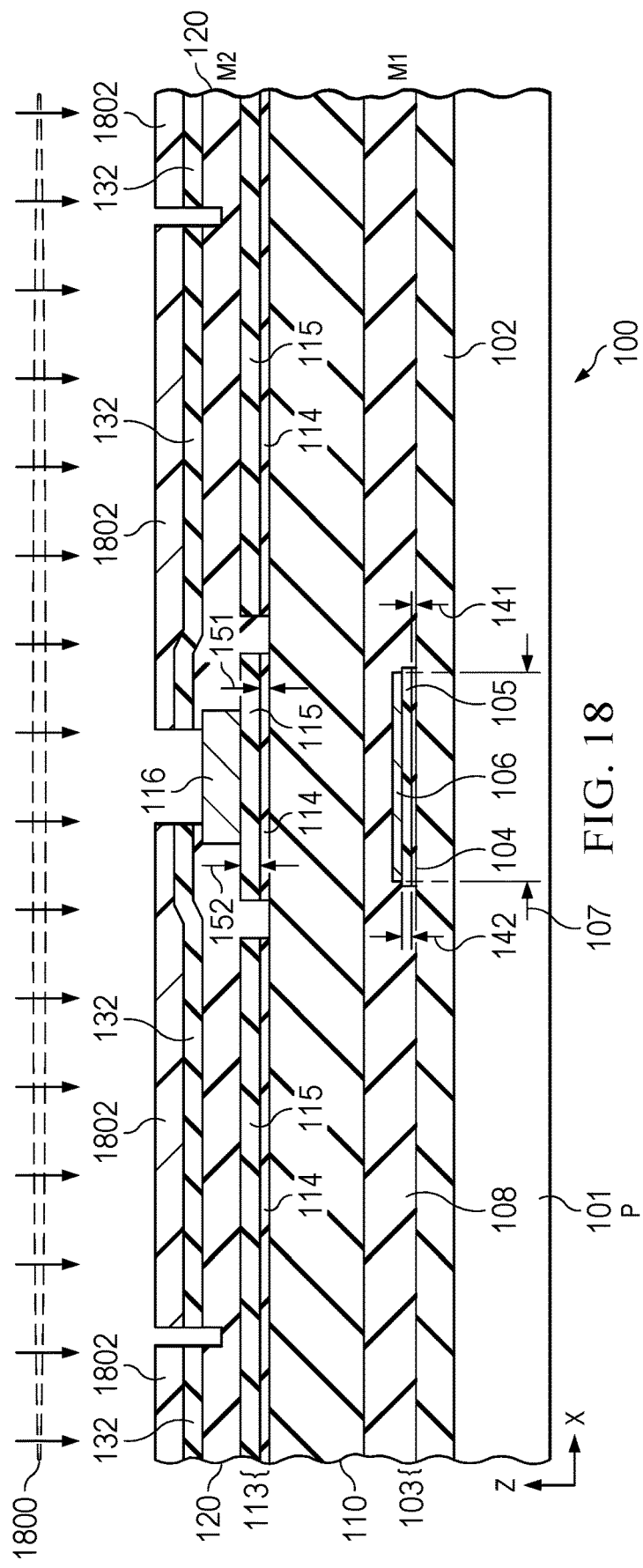
Figure 19:
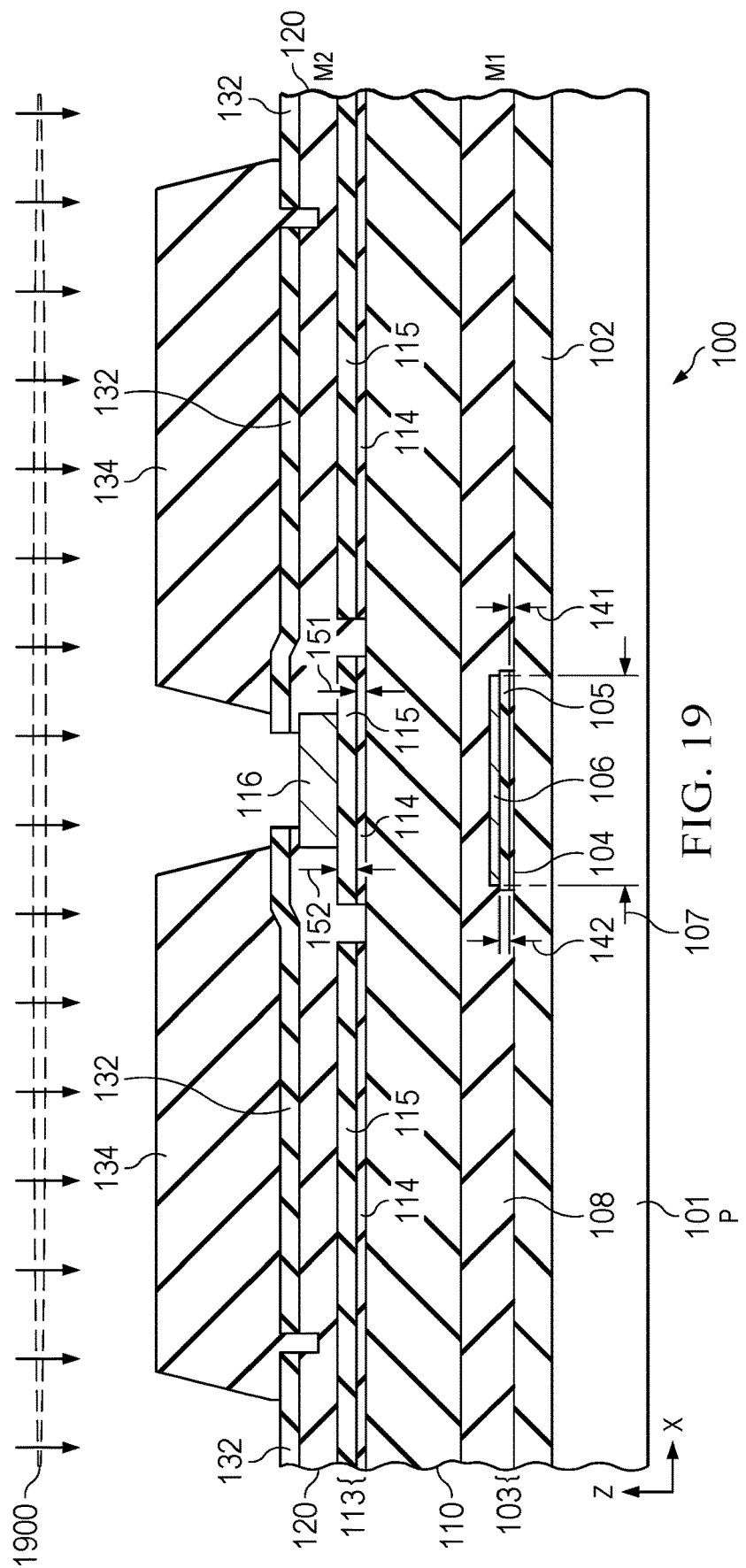

In FIG. 18, an etch process 1800 is performed using a patterned mask 1802 to etch through exposed portions of the silicon oxynitride layer 132 and the oxide layer 120 to expose a portion of the top sides of the second and third capacitor plates 116 and 118 and to form recesses through the silicon oxynitride layer 132 and into the oxide layer 120. In FIG. 19, a process 1900 is performed that forms the polyimide layer 134 which extends into the recesses of the layers 132 and 120 and leaves the portions of the top sides of the respective second and third capacitor plates 116 and 118 exposed.

Figure 20:
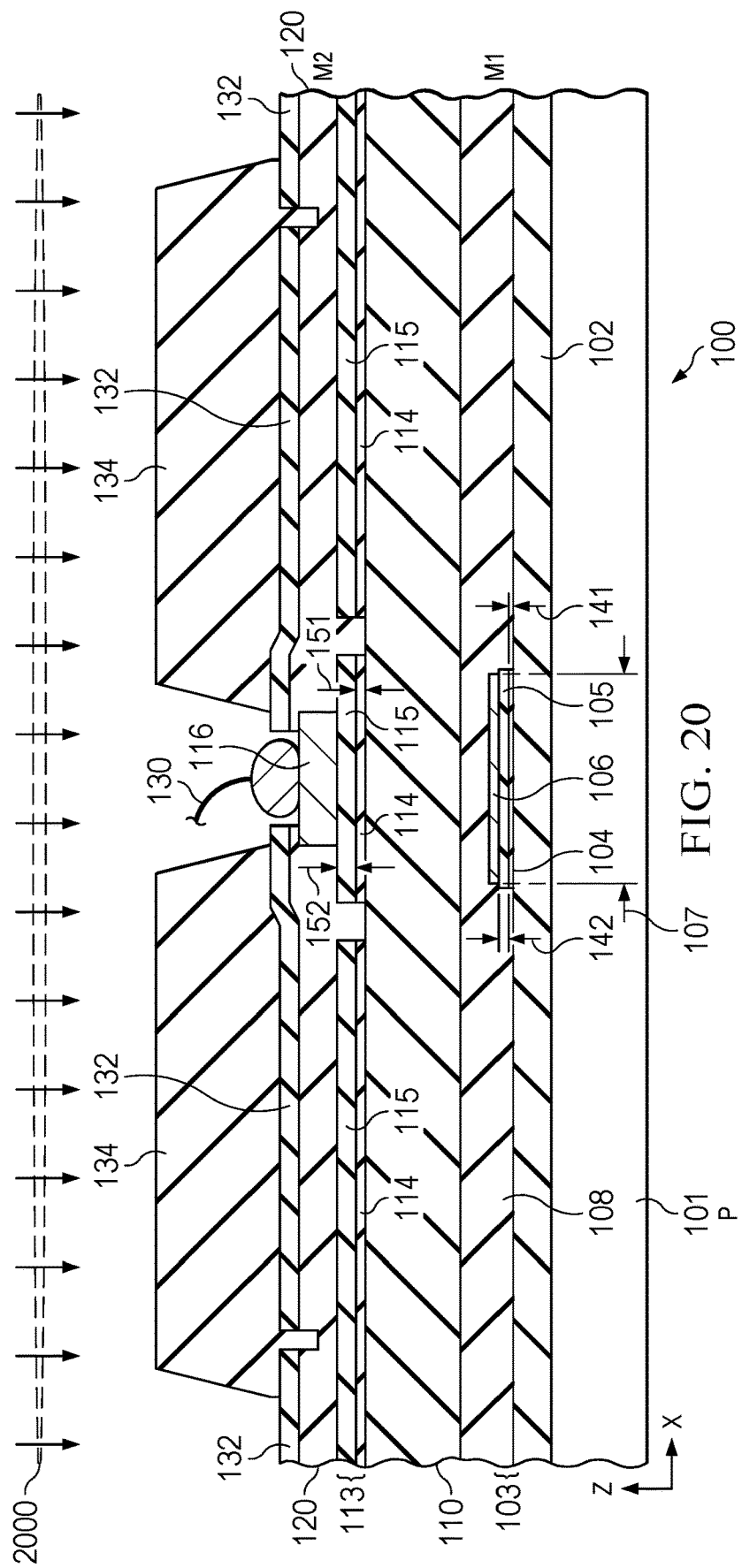
Figure 21:
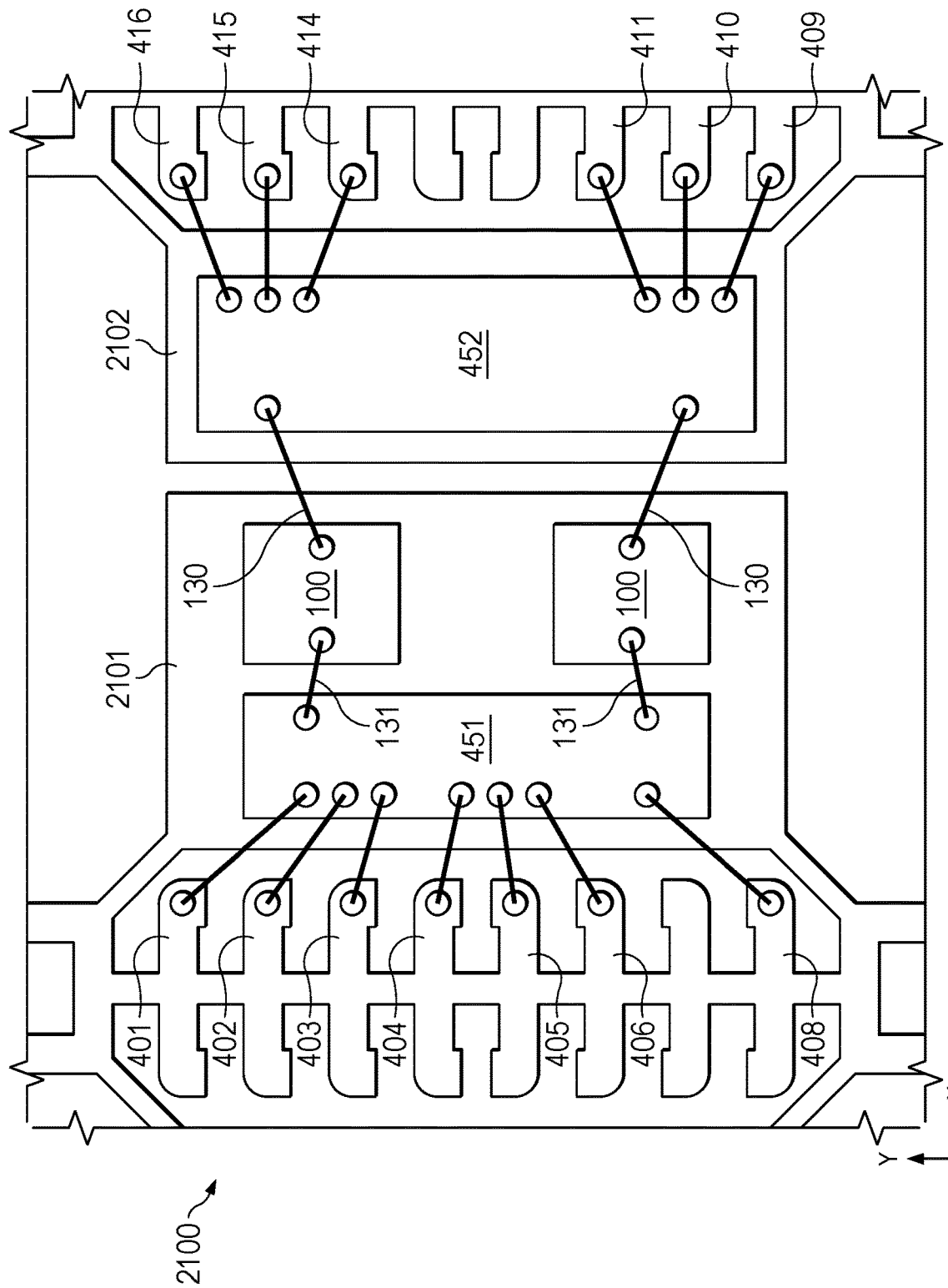

At 522 in FIG. 5, the method 500 continues with die separation or singulation that separates the individual capacitor die electronic devices 100 from the wafer structure. At 524, the method includes die attach processing to attach the capacitor die electronic device along with further dies in a multi-chip module assembly. FIGS. 20 and 21 show portions of the assembly processing. As shown in FIG. 21, two capacitor die electronic devices 100 are attached at 524 to a first die attach pad 2101 of a panel lead frame array 2100, the first semiconductor die 451 is attached to the first die attach pad 2101, and the second semiconductor die 452 is attached to a second die attach pad 2102 of the lead frame array 2100. In another implementation, the electronic device 100 is fabricated with two sets of separated first and second capacitors C1 and C2 as described above, and a single capacitor die with two channels is used.

Figure 22:
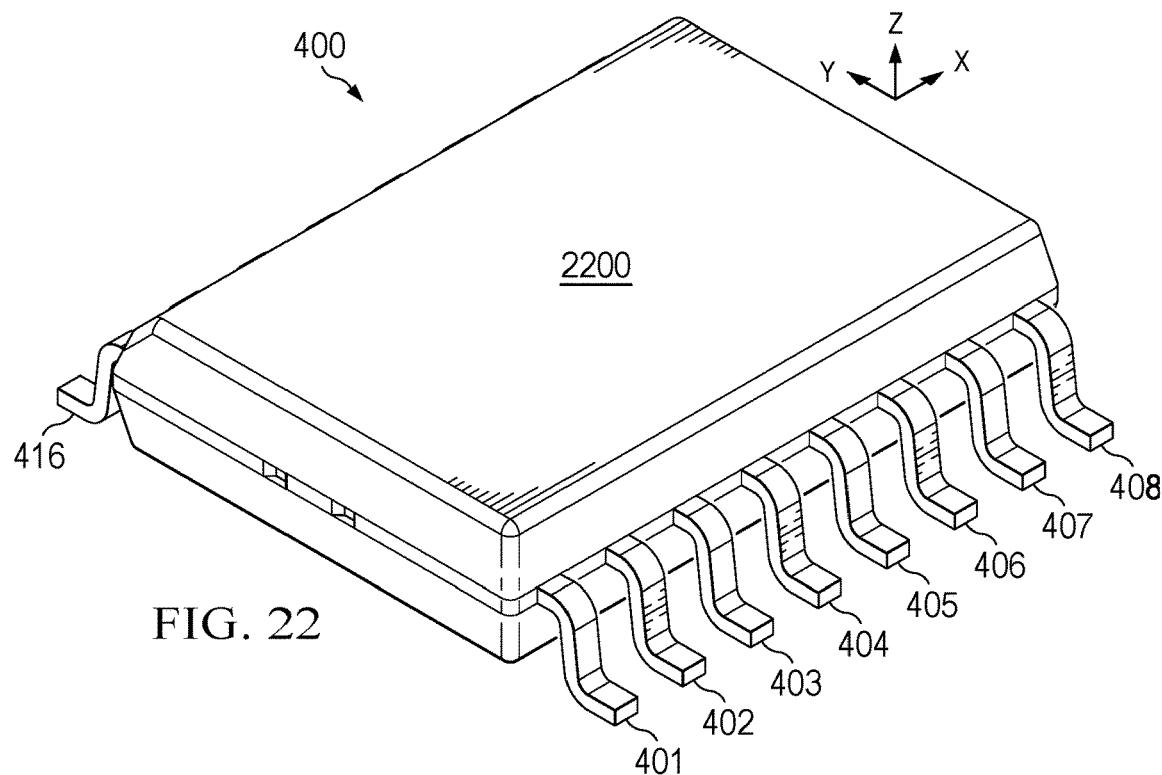

The method 500 continues at 526 in FIG. 5 with wire bonding to form bond wire connections 131 between conductive features of the first semiconductor die 451 and the third capacitor plates 118 of the respective capacitor die electronic devices 100. In addition, further bond wire connections 130 are formed at 526 between conductive features of the second semiconductor die 452 and the second capacitor plates 116 of the respective capacitor die electronic devices 100, as shown in FIGS. 20 and 21. The method 500 also includes molding and device (e.g., package) separation at 528, in which a molded package structure is formed, and individual multi-chip module packaged electronic devices 400 are separated from the panel array. The method 500 in one example also includes lead trimming and forming, if needed, to provide finished packaged electronic devices with gull-wing leads, J-type leads, etc. FIG. 22 shows an example finished module packaged electronic device 400 having gull wing type leads 401-408 and 412 discussed above in connection with FIG. 4, and the internal dies are enclosed in a molded package structure 2200.

Figure 23:
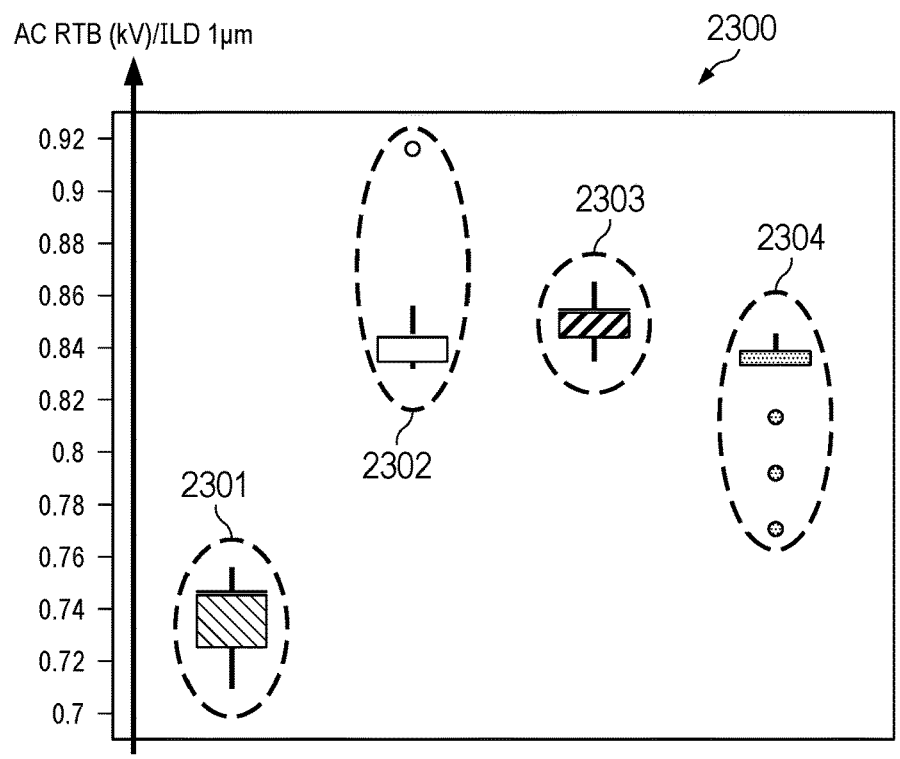
FIG. 23 is a graph of breakdown voltage performance.

FIG. 23 shows a graph 2300 of breakdown voltage performance, including baseline breakdown voltage data points 2301 where the first lower-bandgap dielectric layer 103 is omitted, and three sets of improved breakdown voltage data points 2302, 2303, and 2304 for successively light PMD thicknesses in examples of the electronic device 100 that includes the first lower-bandgap dielectric layer 103 as shown in FIGS. 1-1C above. In these examples, the addition of the SiON/SiN bilayer first lower-bandgap dielectric layer 103 under the bottom capacitor plate 106 improves the isolation capability of the device 100 and prevents low voltage fails. The bilayer first lower-bandgap dielectric layer 103 has a lower bandgap than the first (e.g., PMD) dielectric layer 102 and reduces the effective electric field at the corners of the lower capacitor plate 106 in operation of the electronic device 100. In addition, the lower-bandgap dielectric layer 103 improves high voltage isolation capability such that increasing the PMD thickness has little or no impact.

As discussed above, FIG. 24 shows a side view of another electronic device 2400 having series connected isolation capacitors with low-bandgap dielectric layers under the lower capacitor plate. The electronic device 2400 is a standalone capacitor die electronic device similar to the device 100 described above, where the second lower-bandgap dielectric layer 113 is omitted.

Modifications are possible in the described examples, and other implementations are possible, within the scope of the claims.

What is claimed is:

1. An electronic device, comprising:
a semiconductor layer;
a first dielectric layer above the semiconductor layer;
a second dielectric layer on the first dielectric layer, a bandgap energy of the second dielectric layer being less than a bandgap energy of the first dielectric layer;
a first capacitor plate on the second dielectric layer;
a third dielectric layer above the first capacitor plate; and
a second capacitor plate above the third dielectric layer, the first and second capacitor plates forming a first capacitor.

2. The electronic device of claim 1, wherein:
the second dielectric layer includes a plurality of sublayers, each sublayer having a bandgap energy less than the bandgap energy of the first dielectric layer.

3. The electronic device of claim 2, wherein:
a first sublayer of the plurality of sublayers is disposed on the first dielectric layer; and
a second sublayer of the plurality of sublayers is disposed on the first sublayer, a bandgap energy of the second sublayer being less than a bandgap energy of the first sublayer.

4. The electronic device of claim 3, wherein:
the first sublayer of the plurality of sublayers includes silicon oxynitride; and
the second sublayer of the plurality of sublayers includes silicon nitride.

5. The electronic device of claim 1, wherein the second dielectric layer includes a perimeter surrounding a footprint of the first capacitor plate.

6. The electronic device of claim 1, further comprising:
a fourth dielectric layer on the third dielectric layer, a bandgap energy of the fourth dielectric layer being less than a bandgap energy of the third dielectric layer, wherein the second capacitor plate is on the fourth dielectric layer.

7. The electronic device of claim 6, wherein the fourth dielectric layer includes a perimeter surrounding a footprint of the second capacitor plate.

8. The electronic device of claim 6, wherein:
the fourth dielectric layer includes a plurality of sublayers, each sublayer having a bandgap energy less than the bandgap energy of the third dielectric layer.

9. The electronic device of claim 8, wherein:
a first sublayer of the plurality of sublayers is disposed on the third dielectric layer; and
a second sublayer of the plurality of sublayers is disposed on the first sublayer, a bandgap energy of the second sublayer being less than a bandgap energy of the first sublayer.

10. The electronic device of claim 9, wherein:
the first sublayer of the plurality of sublayers includes silicon oxynitride; and
the second sublayer of the plurality of sublayers includes silicon nitride.

11. The electronic device of claim 1, further comprising:
a third capacitor plate above the third dielectric layer, wherein the third capacitor plate is co-planar with the second capacitor plate and laterally spaced apart from the second capacitor plate, the first and third capacitor plates forming a second capacitor.

12. The electronic device of claim 11, wherein the first capacitor is in series with the second capacitor.

13. The electronic device of claim 11, wherein:
the first capacitor plate includes aluminum;
the second capacitor plate includes aluminum; and
the third capacitor plate includes aluminum.

14. A semiconductor device assembly, comprising:
a first semiconductor die;
a second semiconductor die; and
a capacitor die coupled to the first and second semiconductor dies, the capacitor die including:
a semiconductor layer;
a first dielectric layer above the semiconductor layer;
a second dielectric layer on the first dielectric layer, a bandgap energy of the second dielectric layer being less than a bandgap energy of the first dielectric layer;

a first capacitor plate on the second dielectric layer;
a third dielectric layer above the first capacitor plate;
a second capacitor plate above the third dielectric layer, the first and second capacitor plates forming a first capacitor; and
a third capacitor plate above the third dielectric layer, wherein the third capacitor plate is co-planar with the second capacitor plate and laterally spaced apart from the second capacitor plate, the first and third capacitor plates forming a second capacitor in series with the first capacitor.

15. The semiconductor device assembly of claim 14, further comprising:
a first electrical connection that couples a first conductive feature of the first semiconductor die to the second capacitor plate of the capacitor die; and
a second electrical connection that couples a second conductive feature of the second semiconductor die to the third capacitor plate of the capacitor die.

16. The semiconductor device assembly of claim 14, wherein:
the second dielectric layer includes a plurality of sublayers, each sublayer having a bandgap energy less than the bandgap energy of the first dielectric layer.

17. The semiconductor device assembly of claim 16, wherein:
a first sublayer of the plurality of sublayers is disposed on the first dielectric layer; and
a second sublayer of the plurality of sublayers is disposed on the first sublayer, a bandgap energy of the second sublayer being less than a bandgap energy of the first sublayer.

18. The semiconductor device assembly of claim 14, wherein the second dielectric layer includes a perimeter surrounding a footprint of the first capacitor plate.

19. The semiconductor device assembly of claim 14, further comprising:
a fourth dielectric layer on the third dielectric layer, a bandgap energy of the fourth dielectric layer being less than a bandgap energy of the third dielectric layer, wherein the second capacitor plate is on the fourth dielectric layer.

20. The semiconductor device assembly of claim 19, wherein the fourth dielectric layer includes a perimeter surrounding a footprint of the second capacitor plate.

* * * * *